US006086734A

United States Patent [19]

Harada

[11] Patent Number: 6,086,734

[45] Date of Patent: Jul. 11, 2000

[54] THIN-FILM DEPOSITING APPARATUS

[75] Inventor: Yoshinori Harada, Kashihara, Japan

[73] Assignee: Sharp Kabushiki Kaisha, Osaka, Japan

[21] Appl. No.: 09/293,226

[22] Filed: Apr. 16, 1999

[30] Foreign Application Priority Data

Apr. 16, 1998 [JP] Japan .................................. 10-106778

[51] Int. Cl.[7] ........................... C23C 14/54; C23C 14/56; C23C 14/34; C23C 14/00

[52] U.S. Cl. ................................ 204/298.03; 204/298.02; 204/298.25; 204/298.32; 118/665; 118/712; 118/50; 118/715; 118/663; 118/666; 118/667; 118/669; 118/675; 118/676; 118/679; 118/688; 324/715; 324/716; 324/719; 324/691; 324/158.1

[58] Field of Search ............................ 204/192.1, 192.13, 204/298.02, 298.03, 298.25, 298.32, 192.33; 118/665, 712, 50, 715, 663, 666, 667, 669, 675, 676, 679, 688; 324/715, 716, 719, 691, 158.1; 427/8, 9

[56] References Cited

U.S. PATENT DOCUMENTS 5,698,989 12/1997 Nulman .................................. 324/719

FOREIGN PATENT DOCUMENTS 5-21382 1/1993 Japan .

*Primary Examiner*—Alan Diamond

*Attorney, Agent, or Firm*—Dike, Bronstein, Roberts & Cushman, LLP; David G. Conlin; William J. Daley, Jr.

[57] ABSTRACT

A thin-film depositing apparatus of the present invention deposits a sputtered film on a substrate in a sputtering chamber, and removes the substrate having the sputtered film deposited thereon from the sputtering chamber via a load-lock chamber by a robot arm. As a system for controlling the sheet resistance of the sputtered film deposited on the substrate, a measuring device using an eddy current method is mounted in the proximity of a substrate outlet of the load-lock chamber and measures the sheet resistance of the sputtered film of the substrate removed from the substrate outlet. With this structure, it is possible to provide a thin-film depositing apparatus which stably measures the sheet resistance of a thin film deposited on a substrate and performs feedback of the measurement result to control the film deposition conditions so that a thin film to be deposited on a subsequent substrate has a desired thickness.

38 Claims, 23 Drawing Sheets

1

4

3

2

5

1
2
3
4
5

STOPPED
180 mm
4.3 mm
TIME (S)
DISPLACEMENT IN THE Z DIRECTION (mm)
3
2
1
0
-1
-2
-3
-4
-5
-6
-7
-8
-9
-10
-11
-12
-13
-14
-15
-16

1
2
3
5
11
11a
12
13
14

1
2
2
3
5
17
18
19
360
465
CASSETTE 1
CASSETTE 2
CASSETTE 3
CASSETTE 4 max
min
AVERAGE
APPOXIMATE CURVE
(AVERAGE)
7%
-0.7
-0.5
-0.3
-0.1
0.1
0.3
0.5
0.7
MEASURING HEIGHT (mm)
SHEET RESISTANCE (Ω/cm)

OUTPUT VOLTAGE (V)
TEMPERATURE (°C)
0
10
20
30
40
50
60
70
80
90
100
110
120
130
140
150
160
170
180
190
200
210
220

OUTPUT
DETECTOR CIRCUIT
HIGH FREQUENCY OSCILLATING CIRCUIT
53
54
MAGNETIC MATERIAL
55

OUTPUT(V)
DETECTOR CIRCUIT
HIGH FREQUENCY OSCILLATING CIRCUIT
53
LINE OF MAGNETIC FORCE
EDDY CURRENT
54
55
GAP

POWER SUPPLY
SPUTTERING CHAMBER
SHUTTER
TARGET
56
57
58
59
60
61
62
62

TEMPERATURE (°C)
OUTPUT VOLTAGE ( V )
0
10
20
30
40
50
60
70
80
90
100
110
120
130
140
150
160
170
180
190
200
210
220

THIN-FILM DEPOSITING APPARATUS

FIELD OF THE INVENTION

The present invention relates to a thin-film depositing apparatus for depositing a thin film of a metal or alloy by methods such as sputtering and evaporation.

BACKGROUND OF THE INVENTION

For the deposition of a thin film of a metal or alloy by methods such as sputtering and evaporation, the sheet resistance of a thin film to be deposited is managed. With conventional arts, after a thin film is deposited, the conditions for depositing the next film are determined by measuring the sheet resistance of a substrate removed from a thin-film depositing apparatus. Alternatively, the conditions for depositing a film are determined by placing on a substrate holder together with the substrate, a sheet-resistance monitoring substrate for monitoring the sheet resistance of a sheet being deposited and by measuring the resistance of the monitoring substrate.

An example of a known conventional sheet-resistance measuring method is a four point probe method. The theory of this method will be explained with reference to FIG. 18. First, four needle-like electrodes (probes) 52 are arranged linearly on a metal film 51 subjected to a sheet resistance measurement, a potential difference V between the two inner probes 52 produced by a current flowing through the two outer probes 52 is measured, and the resistance (V/I) is calculated. Thereafter, a resistivity (ρ) is calculated by multiplying the above calculated resistance (R) by a correction factor (F) as a dimensionless value determined by the shape and size of the metal film 51 and the positions of the probes 52. However, the four point probe method suffers from such problems that the metal film 51 is scratched and dust is produced because the probes 52 are brought into contact with the metal film 51 by pressures. Moreover, since the probes 52 are worn down, it is necessary to replace the probes 52 periodically. In addition, the measurement can not be carried out in a vibrating state. Furthermore, this method is limited by a prerequisite of providing a stage which is to be used exclusively for suction. Therefore, if the available space is limited, it is difficult to mount the stage.

An alternative method measures the resistivity of a semiconductor material in a non-contact manner without bringing a metal probe or the like into contact with a sample by pressures. According to this method, as illustrated in FIGS. 19 and 20, with the use of a coil 54 connected to a high frequency oscillating circuit 53, an eddy current is created in a metal layer on a substrate 55 to be measured, i.e., on a glass or wafer, by inductive coupling. At this time, the created eddy current produces Joule's heat and is lost. Since there is a positive correlation between the absorption of high frequency power in a semiconductor wafer and the conductivity, the conductivity (the inverse number of the resistivity) of the semiconductor material can be obtained from the positive correlation in a non-contact manner. Compared with the four point probe method, the above-mentioned measuring method using an eddy current has an advantage because it can evaluate the sheet resistance of a metal layer in a non-contact manner without contaminating the wafer nor applying pressures to the wafer in the final processing step.

However, in a conventional managing method, the measurements of the sheet resistance are carried out randomly by the four point probe method, and the film deposition conditions are controlled according to the results of the measurements. Therefore, if an unexpected defect occurs or the film thickness varies, the substrates having films deposited before the detection of such a defect or a variation in the film thickness are wasted. As a result, the yield is lowered, and the cost is increased.

Another measuring method using an eddy current is disclosed in Japanese laid-open patent publication "Tokukaihei" No. 5-21382 (published on Jan. 29, 1993). In this method, an eddy current is created in a sputtered film in a non-contact manner, and the line of magnetic force resulting from the eddy current is detected and the sheet resistance is calculated.

FIG. 21 shows schematically a cross section of the structure disclosed in the above Japanese patent publication "Tokukaihei" No. 5-21382. Here, a load-lock chamber 57 is formed next to a gate valve 56 of a sputtering room, a transporter 59 for transporting a substrate 58 is provided in the load-lock chamber 57, and a system for controlling the sheet resistance of a sputtered film to be deposited on the substrate 58 is produced in this sputtering device. More specifically, in the load-lock chamber 57, the sheet resistance of the sputtered film is measured using a time in which the temperature of the substrate 58 having the sputtered film deposited thereon is decreased. With this system, the sheet resistance can be measured without lowering the tact. Incidentally, the system includes a resistance measuring device 60 for measuring the resistance of the sputtered film, a gas controller 61 for transmitting a reaction gas flow rate control signal according to the resistance measured, and muss flow controllers 62 for adjusting the amount of the reaction gas in accordance with the control signal transmitted.

An eddy current sensor (resistance measuring device 60) applies a high frequency current to an incorporated coil, and detects the changes in magnetic field and electric field according to the distance from a conductor (sputtered film on the substrate 58) as the change in the inductance of the coil. Hence, the eddy current sensor is electromagnetically sensitive to an extreme extent. Therefore, it is not preferred to install a heater in the proximity of the eddy current sensor as the heater affects the sensor electromagnetically. However, according to the structure described in the above-mentioned publication, the temperature of the substrate 58 after the deposition of the film is high, and the eddy current resistance measuring device 60 is substantially affected by the temperature as shown in FIGS. 22 and 23 due to the influences of the expansion of the coil and the temperature dependence of the sheet resistance. As a result, large variations occur in the sheet resistance.

In order to avoid such variations, it is necessary to maintain a uniform temperature difference between the resistance measuring device 60 and the substrate 58 by performing heating with a heater while preventing a drift of temperature. In other words, in order to achieve high precision by preventing the vicious effects of the temperature variations, it is necessary to actively control the temperatures of the eddy current sensor and the substrate. In addition, it is necessary to satisfy a controversial demand that the original operation and function of the eddy current sensor must be maintained. In order to satisfy the demand, it is necessary to provide temperature control sensor means for maintaining a uniform temperature difference, and a temperature sensor for detecting the temperatures. Consequently, the cost is increased.

Furthermore, in the eddy current sensor, if the gap between the coil and the sputtered film varies, an output of the sensor varies according to the gap. Therefore, the sheet resistance can not be measured accurately. For instance, if the gap is increased, the magnetic flux decreases and the eddy current flowing in the sputtered film decreases. It is thus necessary to maintain a uniform gap between the coil and the sputtered film. Hence, the above-mentioned eddy current sensor creates an eddy current by applying a high frequency magnetic field to an object to be detected (sputtered film) so as to vary the impedance of the sensor coil according to the distance between the eddy current sensor and the object, detects the change in the oscillation state with an amplifier, and measures the distance. However, when the object to be measured is not parallel to the sensor, particularly when the object is vibrated or warped, the distance can not be measured accurately. In actual, it is often the case that the substrate 58 itself is warped by heat deformation. In such a case, if the non-contact type eddy current sensor is used, since a variation in the measuring height occurs, it is difficult to perform accurate measurements.

Besides, if the resistance measuring device 60 is mounted in the load-lock chamber 57, the maintenance efficiency is worse, and the working efficiency is lowered.

SUMMARY OF THE INVENTION

It is an object of the present invention to provide a thin-film depositing apparatus which measures the sheet resistance of a thin film on a substrate in a stable manner and performs feedback of the results of the measurement to control the film deposition conditions so that thin films to be formed on subsequent substrates have a target film thickness.

In order to achieve the above object, a thin-film depositing apparatus of the present invention includes:

- a thin-film depositing chamber for depositing a thin metal film on a substrate;
- a load-lock chamber for taking the substrate out of the apparatus without exposing the thin-film depositing chamber to the atmosphere;
- sheet-resistance measuring means, disposed outside of the load-lock chamber, for measuring a resistance of the thin metal film on the substrate taken out through the load-lock chamber; and
- controlling means for controlling the deposition of the thin film in the thin-film depositing chamber according to the measured resistance so that a thin metal film with a target thickness is deposited on a next substrate.

With this structure, the thin metal film is deposited on the substrate in the thin-film depositing chamber. The substrate with the thin metal film deposited thereon is taken out of the apparatus through the load-lock chamber, and the resistance of the thin metal film is measured by the resistance measuring means.

Since the resistance measuring means is located outside of the load-lock chamber, it is possible to accurately and stably measure the resistance of the thin metal film deposited on the substrate, without the electromagnetic vicious effect and/or thermal vicious effect of the heater, etc. in the load-lock chamber. According to the resistance of the thin metal film thus measured, the deposition of a thin metal film on the next substrate in the thin-film depositing chamber is controlled by the controlling means. Therefore, the thin metal film has a target thickness.

In the above-mentioned processing, the resistance measurement is not performed randomly, but performed for each substrate with a thin metal film formed thereon. Hence, even when a defect substrate having thereon a thin metal film whose thickness is varied for some reasons is produced, a thin metal film is deposited on the next substrate by considering the variation in the film thickness. Thus, a substrate with a thin metal film having a very precisely controlled thickness can be certainly provided in a stable manner.

In addition, since the resistance measuring means is provided outside of the load-lock chamber, the maintenance efficiency is improved compared with a conventional structure in which the resistance measuring means is located in the load-lock chamber.

The resistance measuring means may be a one-side measuring device using an eddy current method with a single sensor head, and the sensor head may be disposed to face the substrate subjected to the resistance measurement.

According to this structure, since the one-side measuring device using the eddy current method is used as the resistance measuring means, it is possible to provide a more compact apparatus requiring a less space compared with an apparatus including a double-side measuring device using the eddy current method.

Moreover, in this structure, the sensor head may be arranged to be movable in a direction along the thickness of the thin film on the substrate subjected to the resistance measurement.

With this arrangement, it is possible to control the distance between the substrate subjected to the sheet resistance measurement and the sensor head to be within a desired range by driving the sensor head in a direction along the thickness of the thin film on the substrate. Therefore, even when the substrate is vibrated during a transport thereof, it is possible to eliminate the waiting time for the attenuation of the vibration, measure the resistance without making the tact time longer, and control the film deposition conditions efficiently.

For a fuller understanding of the nature and advantages of the invention, reference should be made to the ensuing detailed description taken in conjunction with the accompanying drawings.

DESCRIPTION OF THE PREFERRED EMBODIMENTS

Embodiment 1

The following description will explain an embodiment of a thin-film depositing apparatus according to one embodiment of the present invention. The thin-film depositing apparatus includes a sputtering chamber (vacuum container), a transport chamber provided next to the sputtering chamber with a gate valve therebetween, and a load-lock chamber positioned next to the transporting chamber. A transporter for transporting a substrate is mounted in the load-lock chamber. After a sputtered film (thin metal film) is deposited on a surface of a substrate in the sputtering chamber, the substrate is once transported via the transporting chamber to the load-lock chamber. Thereafter, in a gate valve closed state, the substrate is taken out of the thin-film depositing apparatus from the load-lock chamber. With the above-mentioned structure, it is possible to place and remove the substrate in/from the thin-film depositing apparatus without exposing the sputtering chamber to the atmosphere. However, the present invention is not necessarily limited to the thin-film depositing apparatus which deposits a thin metal film by sputtering. In other words, it is possible to apply the present invention to a thin-film depositing apparatus which forms a thin metal film by CVD (chemical vapor deposition).

Figure 1:
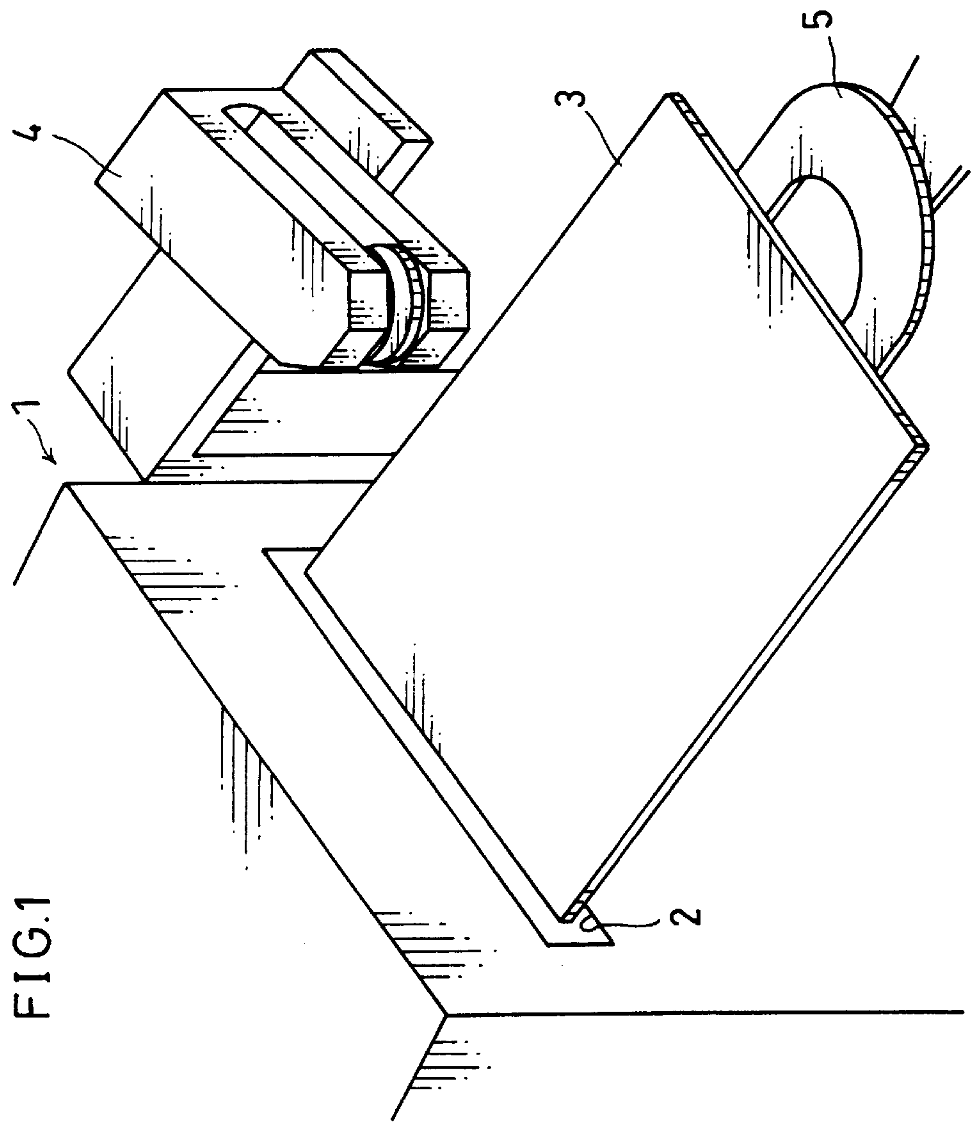
FIG. 1 is a perspective view showing the appearance of a part of a thin-film depositing apparatus according to an embodiment of the present invention, wherein a double-side measuring device using an eddy current method is provided in the proximity of an outlet (substrate outlet) of a load-lock chamber.

As illustrated in FIG. 1, provided in the proximity of a substrate outlet 2 of a load-lock chamber 1 is a measuring device using the eddy current method (resistance measuring means, sheet-resistance measuring means) 4 as a system for controlling the resistance of a sputtered film to be deposited on a substrate 3 (hereinafter referred to the "sheet resistance"). More specifically, the measuring device using the eddy current method 4 is arranged so as to measure the resistance on a path along which the substrate 3 is removed from the substrate outlet 2. Thus, the measuring device using the eddy current method 4 has the advantage that it is easily mounted without requiring a large-scale reconstruction. The placement and removal of the substrate 3 in/from the load-lock chamber 1 are carried out with a robot arm 5.

Figure 2:
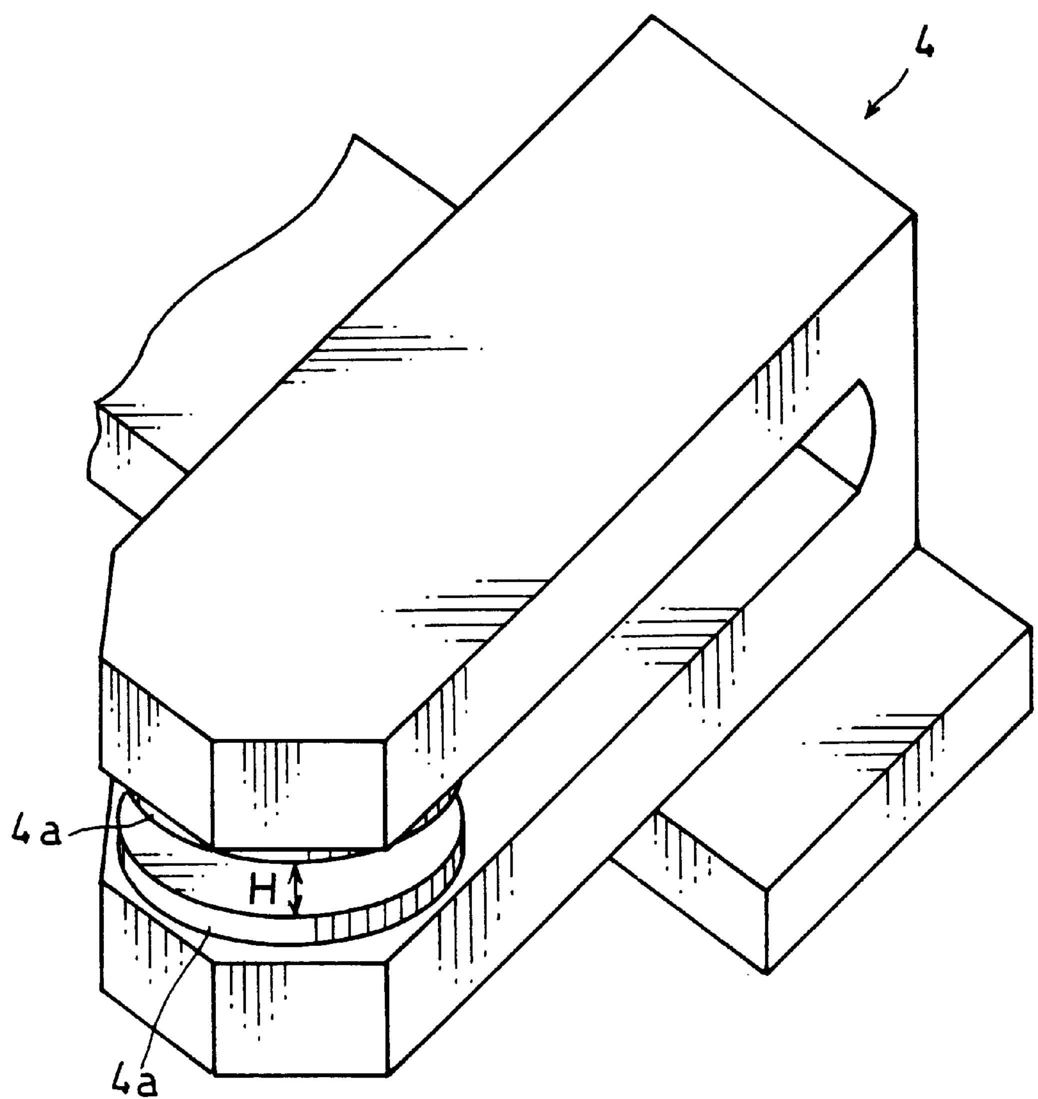
FIG. 2 is a perspective view showing the appearance of the double-side measuring device using the eddy current method of the thin-film depositing apparatus.

As the measuring device using the eddy current method 4, a double-side measuring device is used. As illustrated in FIG. 2, the double-side measuring device includes two sensor heads **4*a* arranged to face each other with a gap of a measuring height H therebetween. For the measurement of the resistance of the sputtered film deposited on the surface of the substrate 3, the substrate 3 is inserted into the gap section between the sensor heads 4*a*. Each of the sensor heads 4*a* includes a ferrite core coil coupled with a high frequency circuit, and applies a high frequency to the substrate 3 through the coil. As a result, an eddy current is created in the sputtered film on the substrate 3** by inductive coupling. The created eddy current produces Joule's heat and is lost.

In this case, it is possible to know the conductivity (the inverse number of the resistivity) of the semiconductor material in a non-contact manner based on the positive correlation between the absorption of the high frequency power in the sputtered film and the conductivity of the sputtered film.

The thin-film depositing apparatus of this embodiment is managed by a CIM (computer integrated manufacturing) system (controlling means), and the results of measurements by the measuring device using the eddy current method 4 are output to a processor section of the system. The relational expression obtained by measuring the relationship between the thickness and sheet resistance of the metal film (i.e., the sputtered film on the surface of the substrate 3) was input to the processor section in advance, and the thickness of the metal film can be obtained by inputting the measured sheet resistance into the relational expression. Thus, by using the system for measuring the sheet resistance on-line to the film depositing step and performing feed-back of the output indicative of the measured sheet resistance, it is possible to control the procedure (film deposition conditions) in the film depositing step, if necessary, so that the outputs of the measuring device (the value of the sheet resistance) are uniform.

Figure 3:
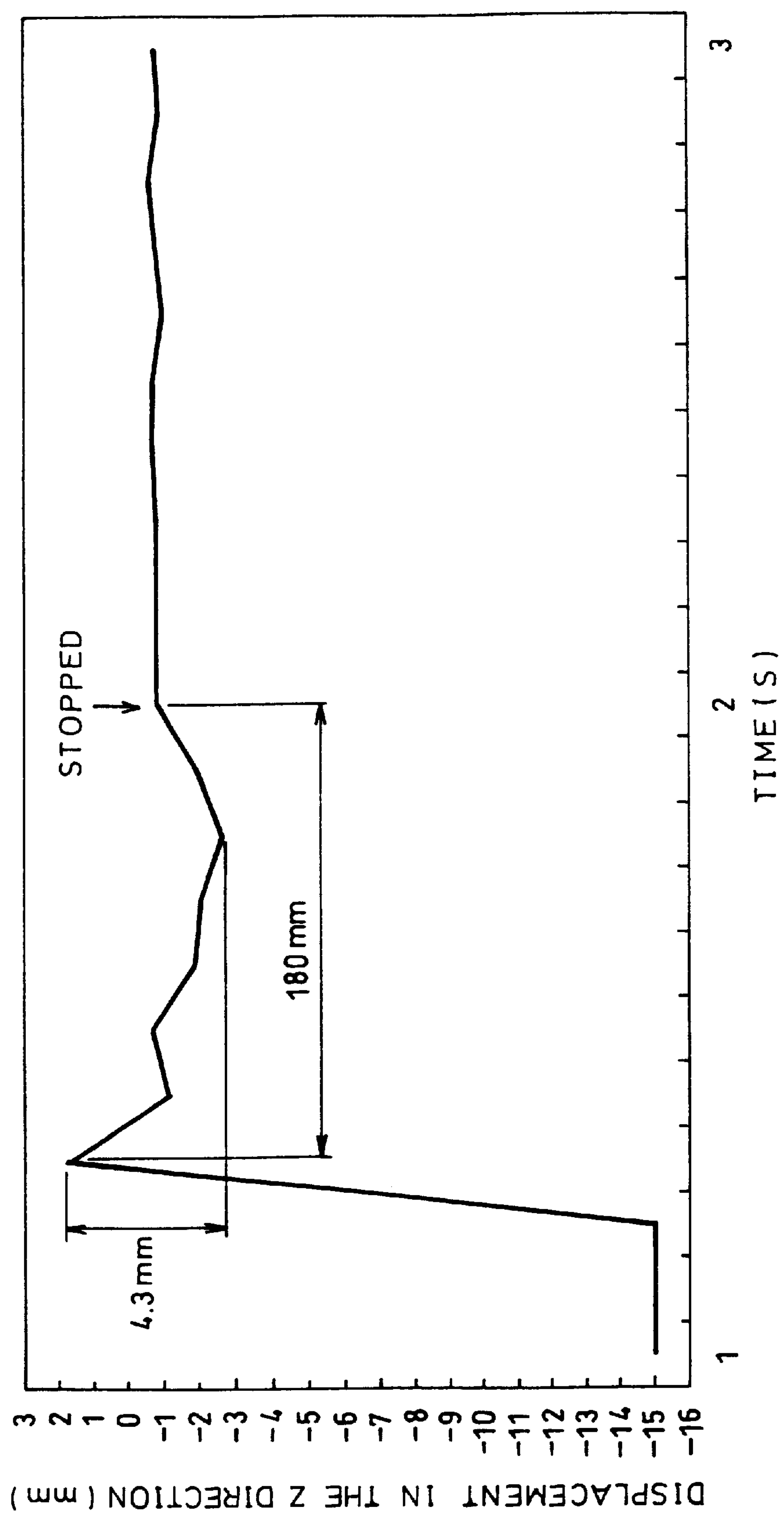
FIG. 3 is a graph showing the results of measuring the vibration of a substrate when the substrate is moved horizontally by a robot arm.
Figure 14:
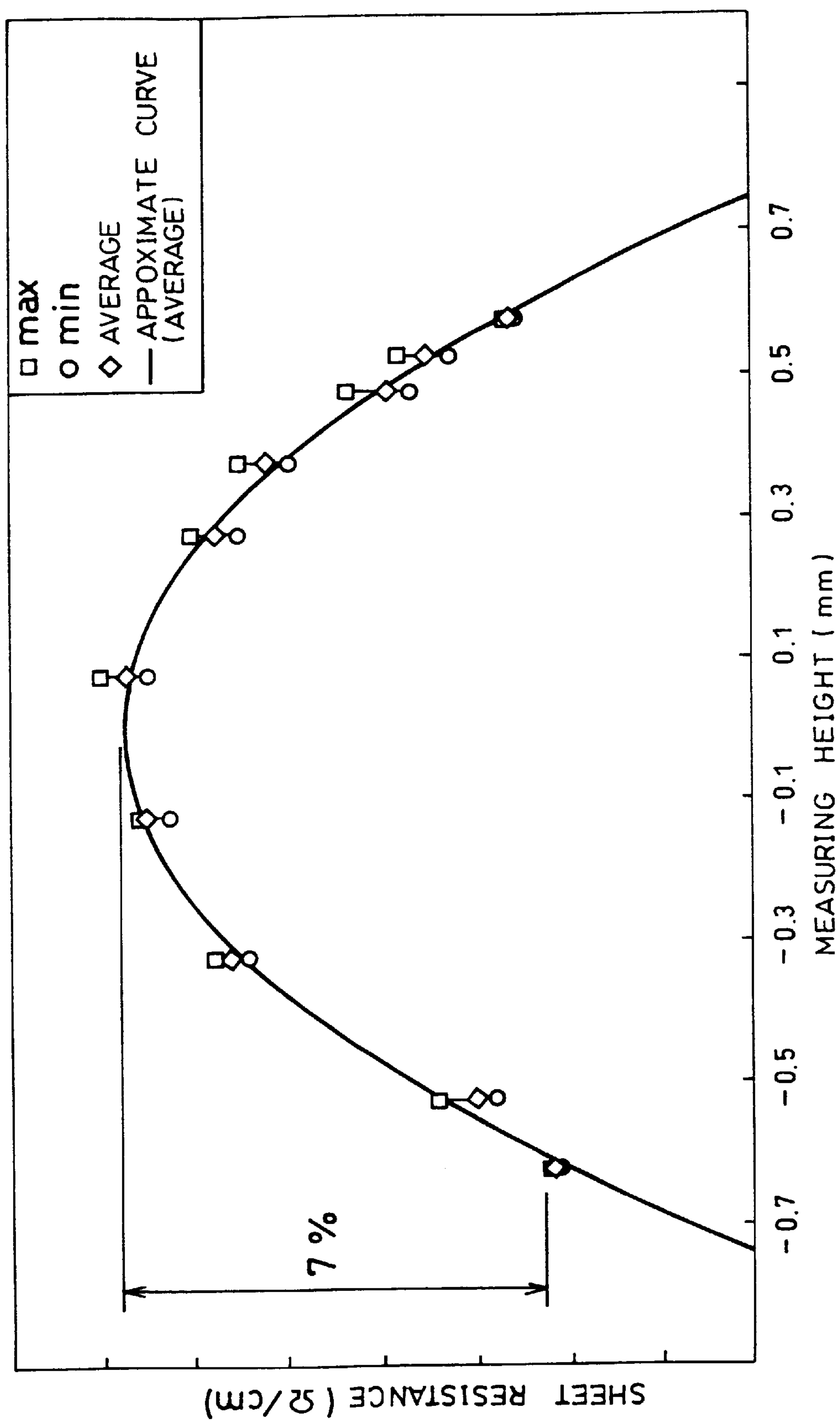
FIG. 14 is a graph showing the dependence of the measured sheet resistance of a thin tantalum film on the height in the gap (measuring height) of a double-side measuring device using the eddy current method.

In the structure shown in FIG. 1, although the gap between the sensor heads 4*a* of the measuring device using the eddy current method 4 is fixed, the distance between the sensor head 4*a* and the substrate 3 (the measuring height) varies because the substrate 3 is vibrated by the robot arm 5 when the substrate 3 is removed from the load-lock chamber 1 by the robot arm 5 or the substrate 3 itself is warped. When the measuring height varies, as shown in FIG. 14 (indicating the results of measuring a thin tantalum film), errors of a maximum of 7% occur in the sheet resistance (if the error range of the measuring height is within ±0.7 mm), the sheet resistance is not measured accurately, and unexpected defects within ±5% can not be managed. Therefore, in order to achieve an accurate measurement, it is necessary to perform the measurement by stopping the substrate at a measurement position and waiting for the vibration is settled down. In this case, as shown in FIG. 3, a standby time of about two seconds is required to settle down the vibration of the substrate 3.

Figure 4:
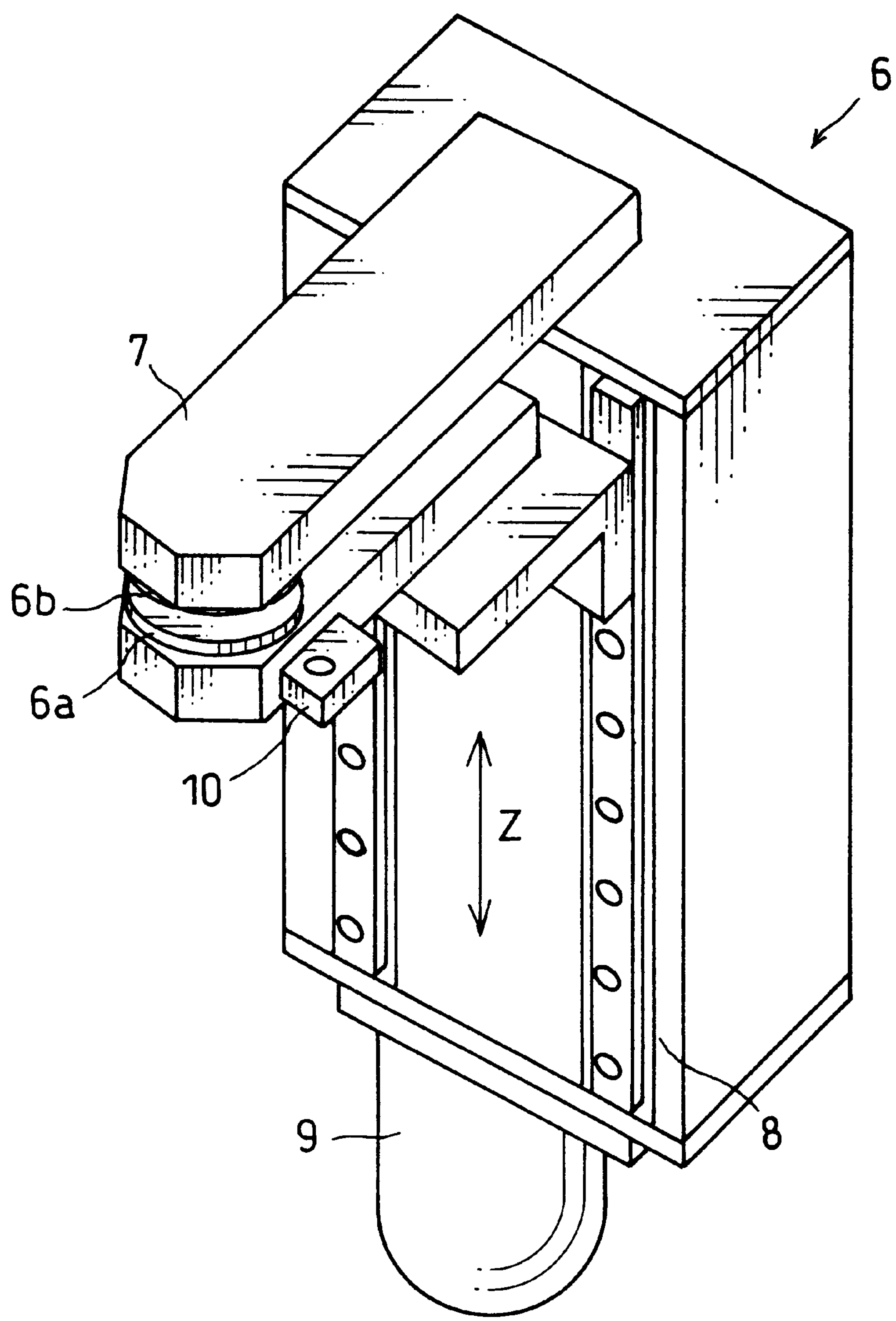
FIG. 4 is a perspective view showing the appearance of a double-side measuring device using the eddy current method wherein the gap between sensor heads is variable.

In order to improve the measurement precision of the sheet resistance without requiring the standby time, it is possible to use a measuring device using the eddy current method (sheet-resistance measuring means) 6 including sensor heads 6*a* and 6*b* whose gap is variable as shown in FIG. 4, instead of the above-mentioned measuring device using the eddy current method 4. The measuring device using the eddy current method 6 has the sensor head 6*a* which is movable in the directions along an Z axis. A supporting member 7 to which the sensor head 6*a* is attached is mounted on a Z-axis moving stage 8, and driven by a Z-axis moving motor 9. In the above-mentioned example, only the sensor head 6*a* is drivable. However, both of the sensor heads 6*a* and 6*b* may be arranged to be drivable. In the explanation of this embodiment, the direction of the thickness of a thin metal film deposited on the substrate 3 is defined as the Z-axis direction, X-axis and Y-axis are present in the plane of the substrate 3, and X, Y, and Z-axes cross each other at right angles.

The distance between the sensor head 6*a* and the substrate 3 is detected by a substrate detecting sensor 10 attached to the supporting member 7. By performing feedback of the result of the detection to a drive control section (not shown) of the Z-axis moving motor 9, the distance between the sensor head 6*a* and the substrate 3 is controlled to have an appropriate value.

Figure 17:
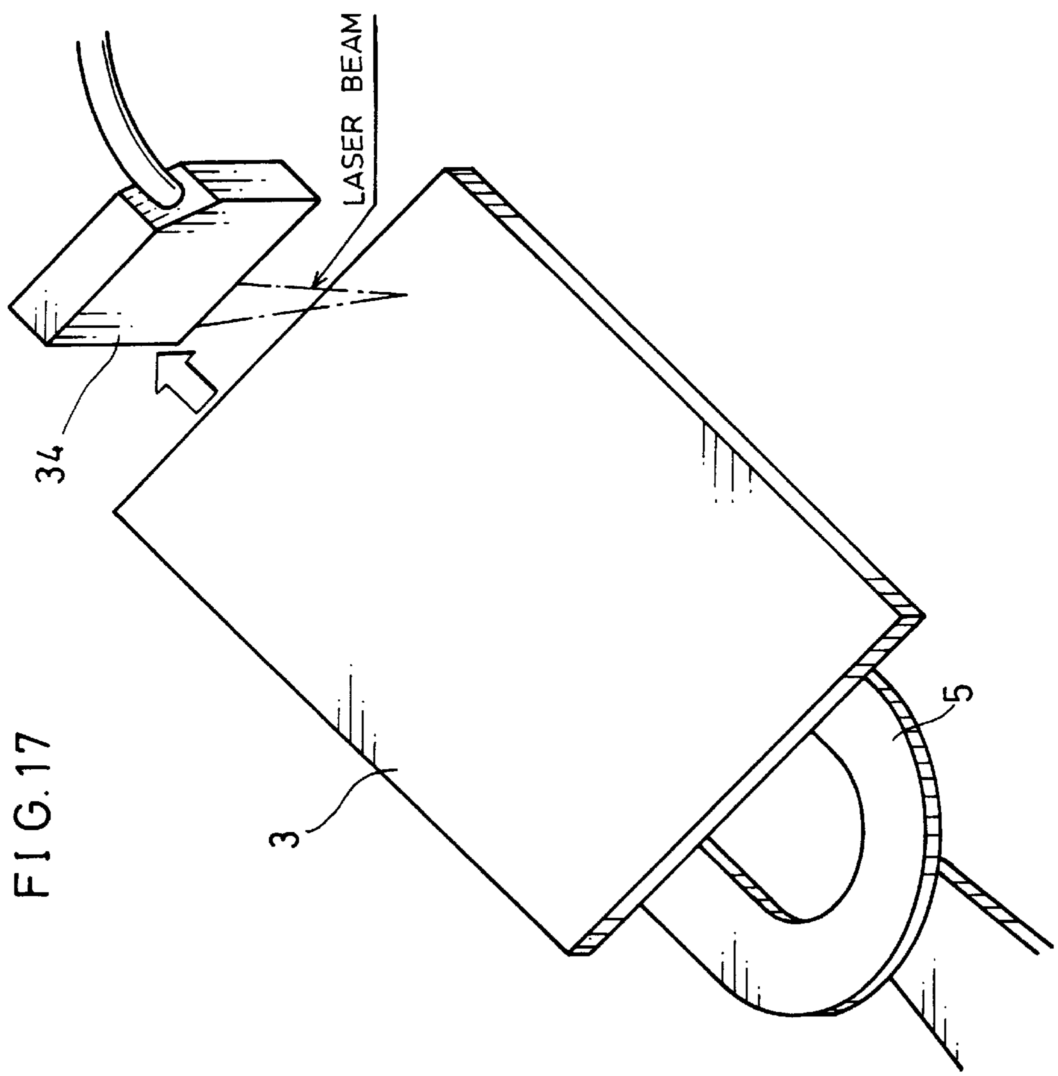
FIG. 17 is a view for explaining the measurement of displacement of the substrate with a laser displacement sensor.
Figure 18:
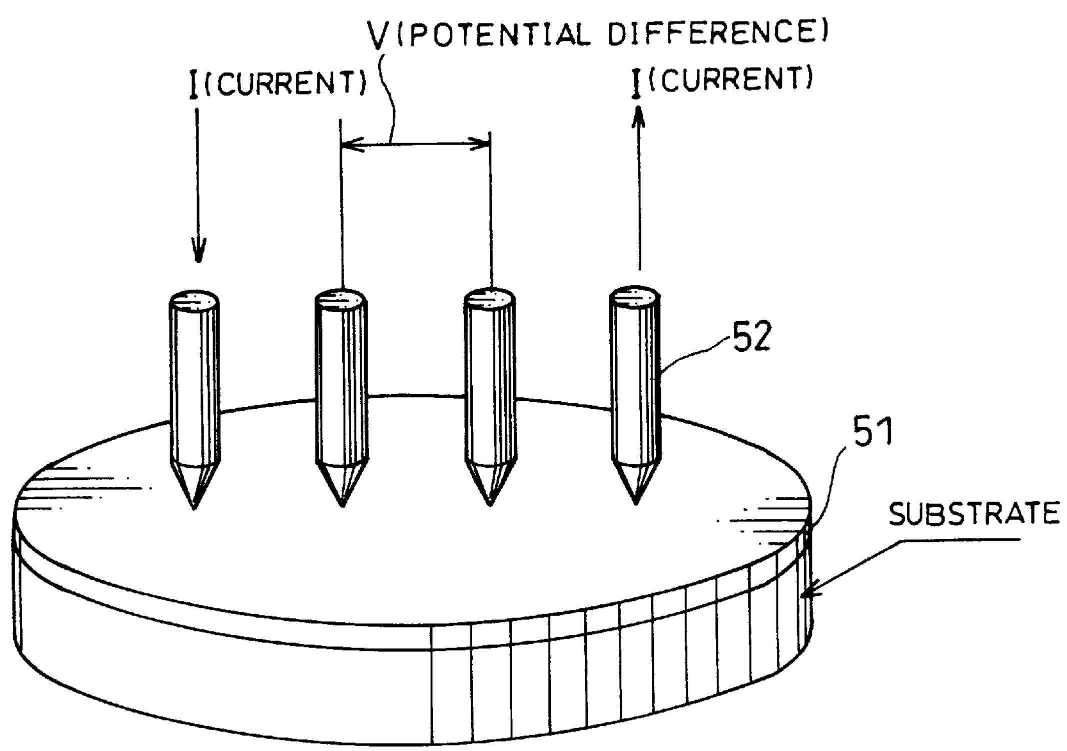
FIG. 18 is a view for explaining the theory of a four point probe method.
Figure 19:
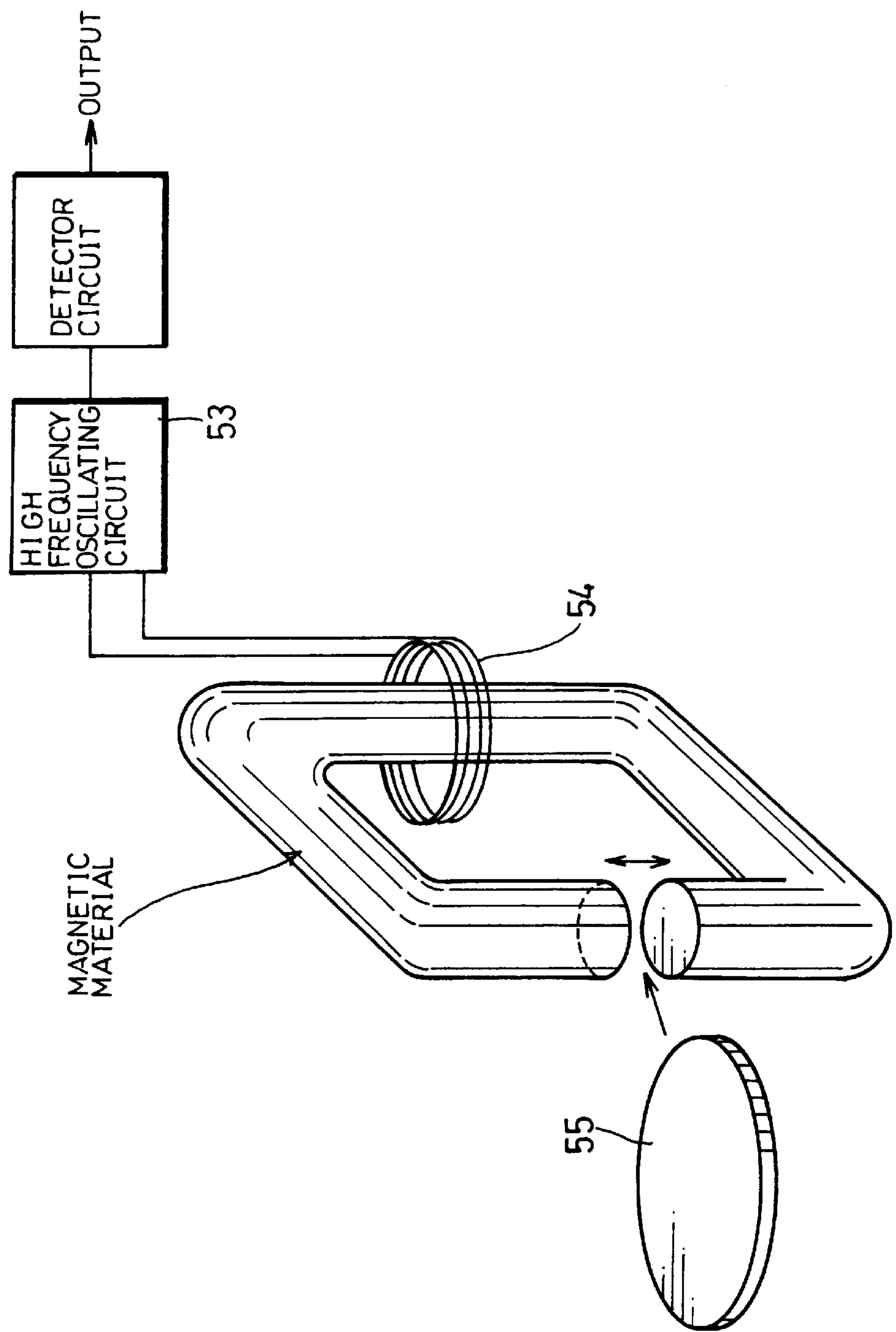
FIG. 19 is a view for explaining the theory of a double-side measuring device using the eddy current method.
Figure 20:
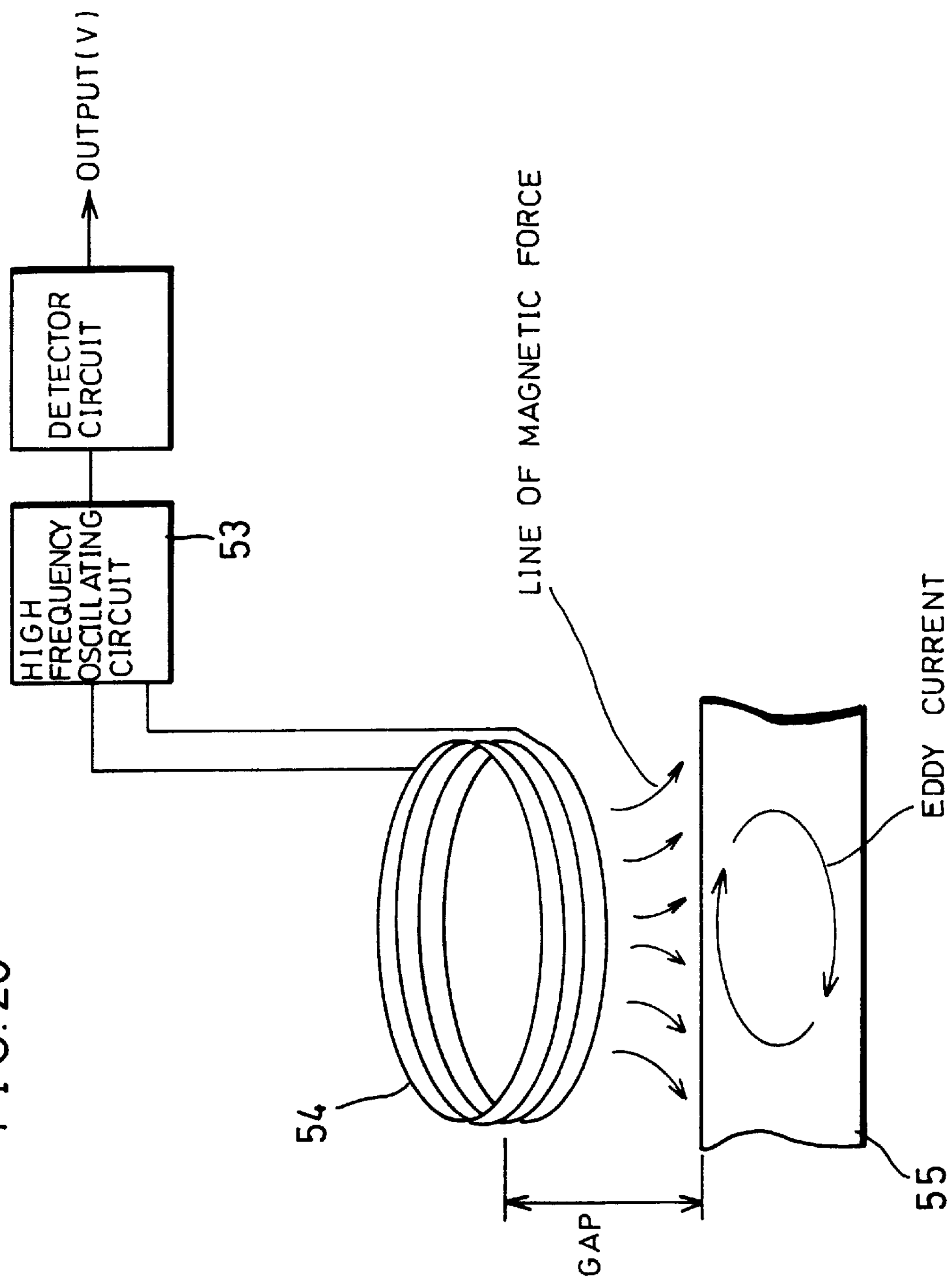
FIG. 20 is a view for explaining the theory of a one-side measuring device using the eddy current method.
Figure 21:
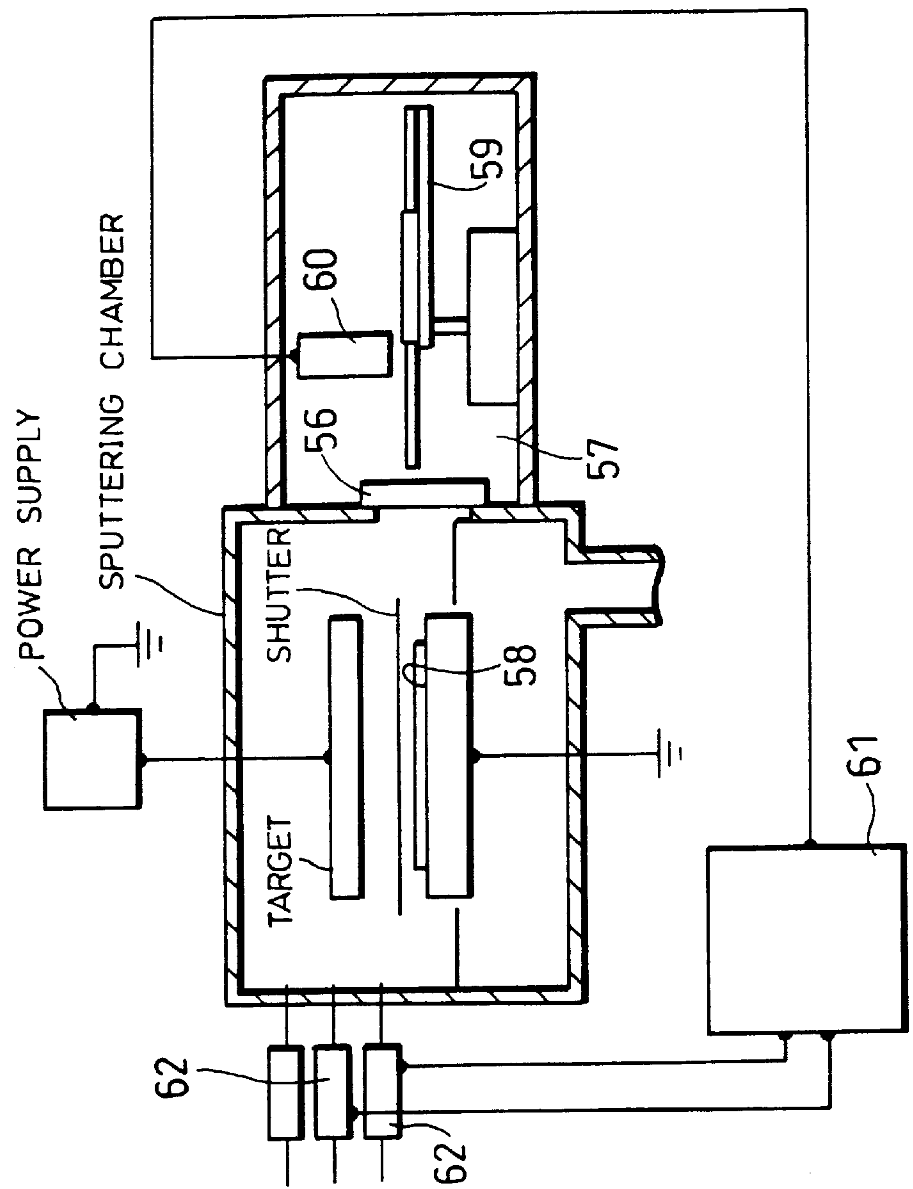
FIG. 21 is a cross sectional view showing a schematic structure of a conventional thin-film depositing apparatus.
Figure 22:
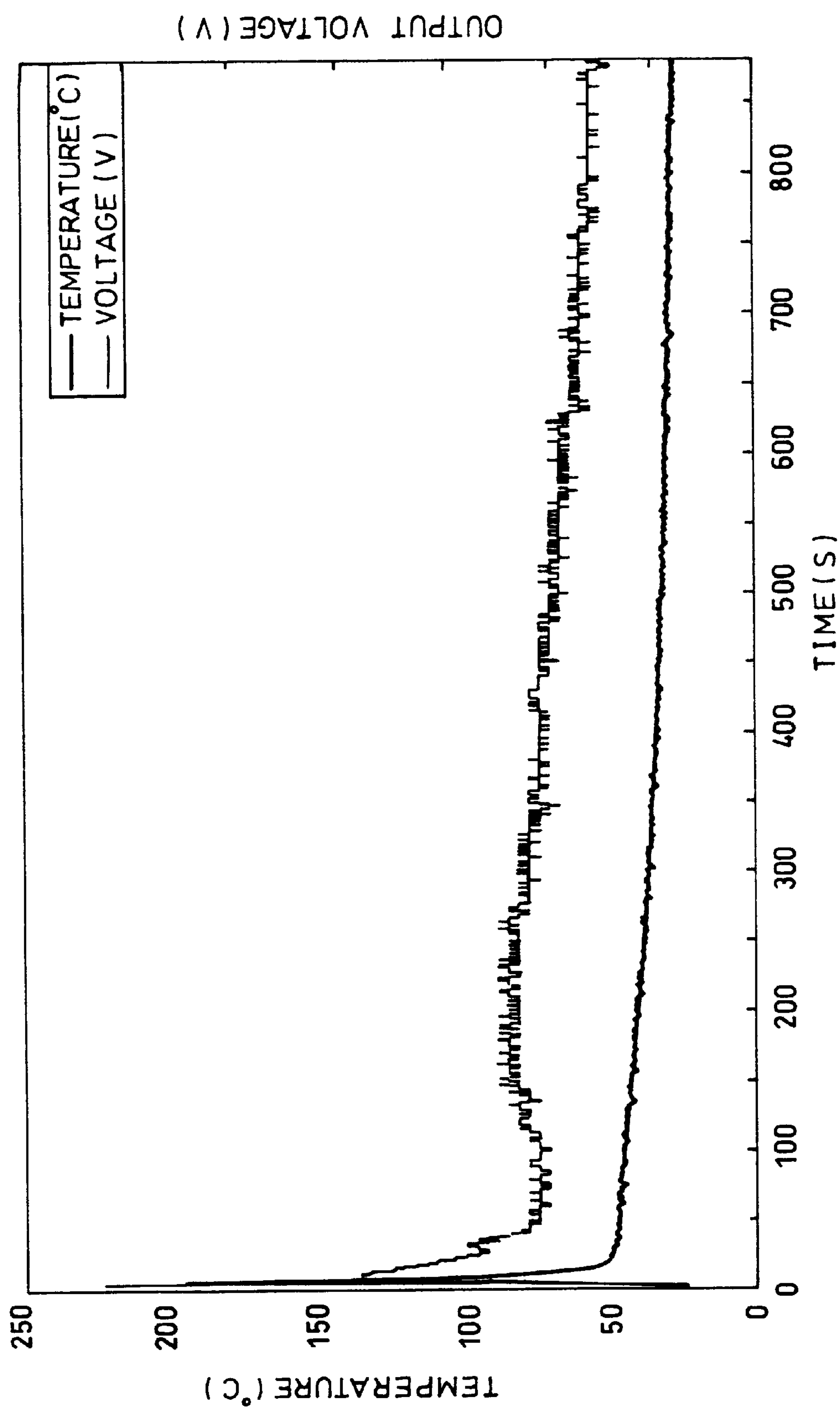
FIG. 22 is a graph showing the changes in the voltage output of the measuring device using the eddy current method and the temperature with time when the sheet resistance of a thin tantalum film was measured.

In order to detect the distance between the sensor head 6*a* and the substrate 3, it is possible to use a sensor which is provided independently of the measuring device using the eddy current method 6 as shown in FIG. 17, instead of the above-mentioned substrate detecting sensor 10 attached to the supporting member 7. The sensor used in FIG. 17 is a laser displacement sensor 34, and can detect the displacement of the substrate 3 by irradiating a laser beam on the substrate 3.

Embodiment 2

Figure 5:
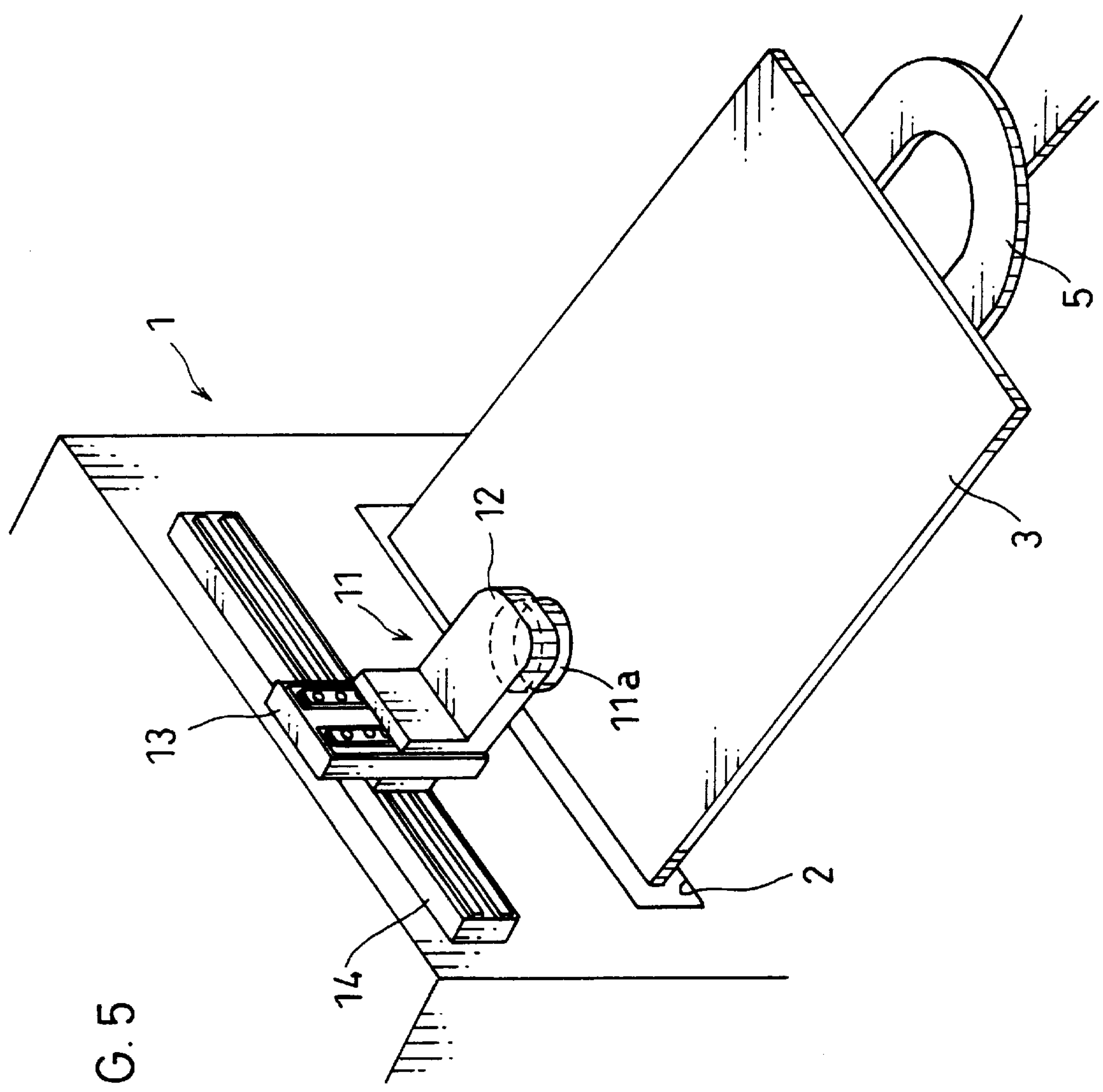
FIG. 5 is a perspective view showing the appearance of a part of a thin-film depositing apparatus according to another embodiment of the present invention, wherein a one-side measuring device using the eddy current method is provided in the proximity of an outlet (substrate outlet) of a load-lock chamber.

A thin-film depositing apparatus according to the second embodiment has almost the same structure as the thin-film depositing apparatus of the first embodiment. However, as illustrated in FIG. 5, the thin-film depositing apparatus of the second embodiment includes a one-side measuring device using the eddy current method (sheet-resistance measuring means) 11 as a system for controlling the sheet resistance of a sputtered film to be deposited on the substrate 3. The measuring device using the eddy current method 11 is mounted in the proximity of the substrate outlet 2 of the load-lock chamber 1. The placement and removal of the substrate 3 in/from the load-lock chamber 1 are carried out with the robot arm 5.

The measuring device using the eddy current method 11 includes a single sensor head 11*a* having a ferrite core coil. When measuring the sheet resistance of the sputtered film on the surface of the substrate 3, the sensor head 11*a* is arranged to face the substrate 3 with a predetermined distance therebetween. A supporting member 12 on which the sensor head 11*a* is mounted is fastened to both of a Z-axis moving stage 13 and an X-axis moving stage 14, and drivable in the directions along both of the Z-axis and the X-axis. More specifically, even when the substrate 3 is vibrated, the sensor head 11*a* can maintain a uniform distance between the substrate 3 and the sensor head 11*a* itself by its movement in a direction along the Z-axis. Therefore, the sensor head 11*a* can measure the sheet resistance without being influenced by the vibration of the substrate 3. Moreover, the sheet resistance can be measured at a plurality of points on the substrate 3 by the movement of the sensor head 11*a* in a direction along the X-axis.

Figure 16:
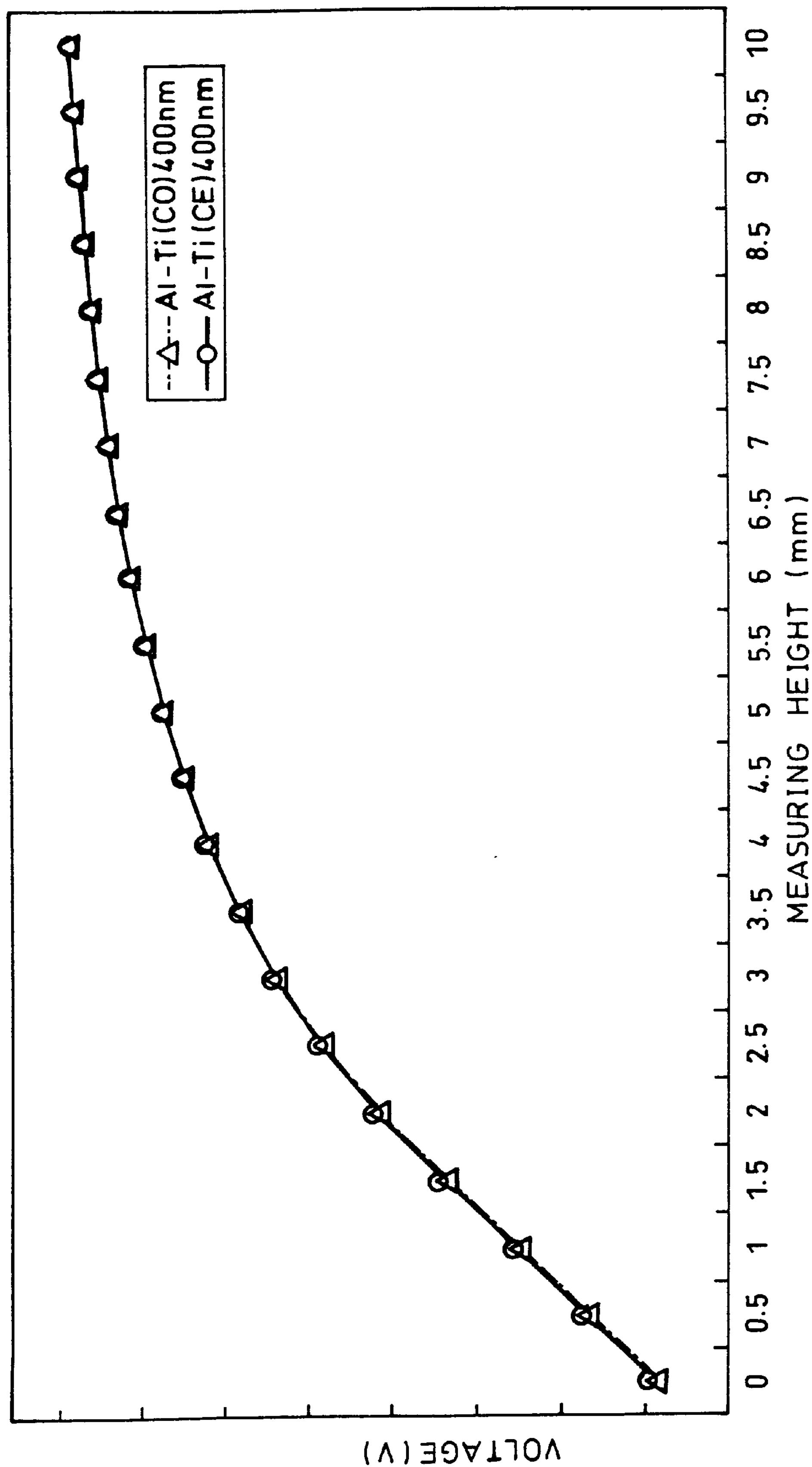
FIG. 16 is a graph showing the dependence of the output voltage on the measuring height when the sheet resistance of a thin aluminum film was measured by the one-side measuring device using the eddy current method.

Furthermore, compared with a double-side type measuring device, the one-side measuring device using the eddy current method 11 can realize a more compact apparatus requiring a less space. However, as illustrated in FIG. 16 (indicating the results of measuring a thin aluminum film), as the measuring height increases, the output voltage is saturated. On the other hand, as the measuring height decreases, an output having more linearity can be obtained. Thus, a preferred measuring height is between about 1 and 3 mm. Besides, the conditions such as the measurable distance and the sensitivity vary depending on the number of turns and the diameter of the coil, etc.

Embodiment 3

Figure 6:
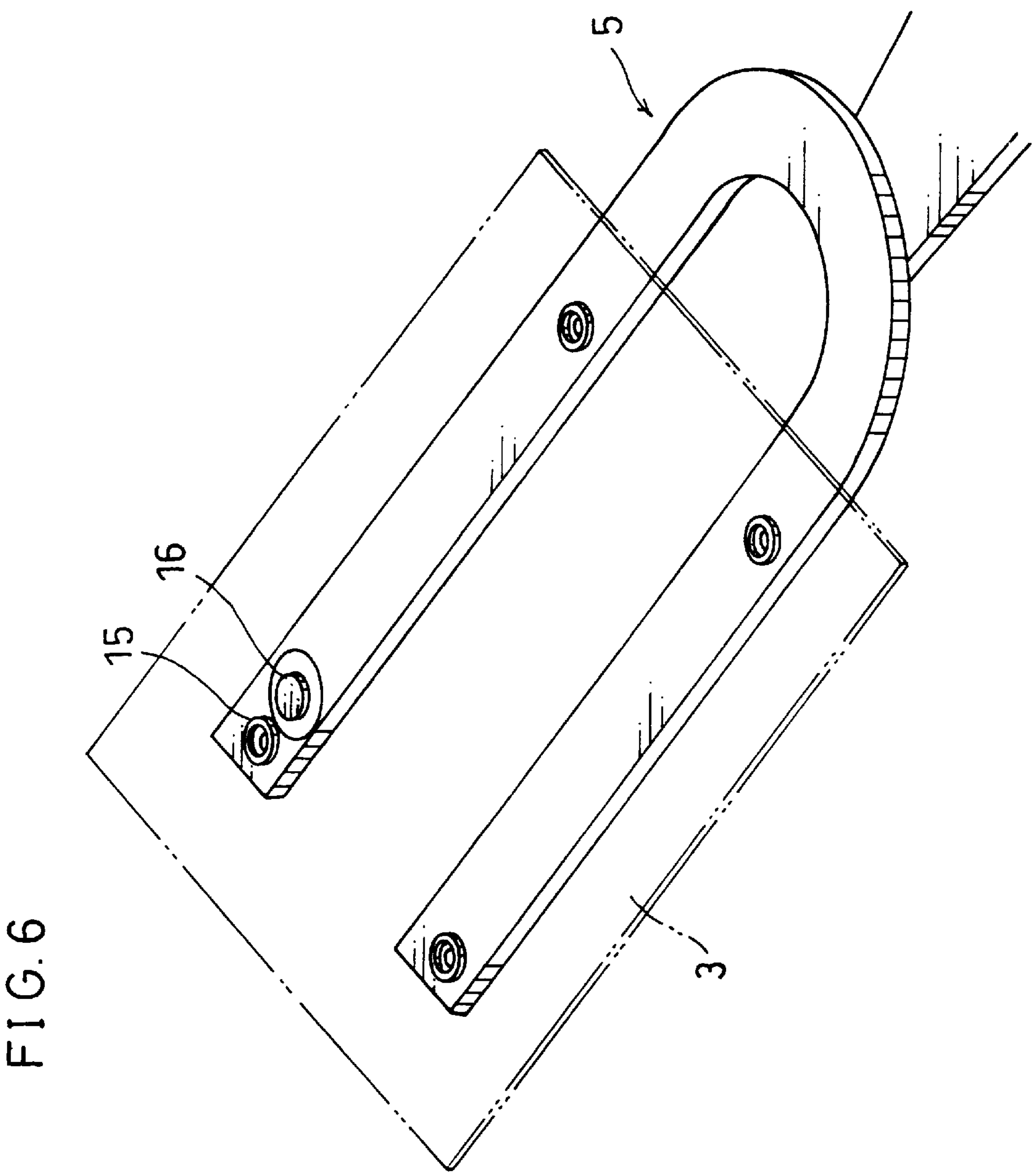
FIG. 6 is a perspective view of another embodiment of the present invention, showing an example in which a measuring device using the eddy current method is incorporated in a robot arm for transporting a substrate.

A thin-film depositing apparatus according to the third embodiment has almost the same structure as the thin-film depositing apparatus of the first embodiment. However, in the thin-film depositing apparatus of the third embodiment, the measuring device using the eddy current method is not mounted in the proximity of the substrate outlet 2 of the load-lock chamber 1, but attached to the robot arm 5 for placing and removing the substrate 3 in/from the load-lock chamber 1 as shown in FIG. 6.

The robot arm 5 has a substantially U-shape, and includes, in its holding plane on which the substrate 3 is to be held, suction pads (suction sections) 15 for holding the substrate 3 in a stable manner and a sensor head 16 of a measuring device using the eddy current method (sheet-resistance measuring means) for measuring the sheet resistance of a sputtered film on the substrate 3.

In this embodiment, a lot of the substrates 3 having films deposited thereon are stored as a unit in a cassette. After air-cooling the lot of the substrates 3 removed from the load-lock chamber 1 for about five minutes, the substrates 3 are moved into an AGV (automatic guided vehicle) transport-use cassette. The sheet resistance is measured during the movement of the substrates 3 into the AGV transport-use cassette. Therefore, even when the air-cooling period is provided, it is possible to measure the sheet resistance without lowering the tact. The result of measuring the sheet resistance is immediately output to a CIM system. If the measurement value is an abnormal value, confirmation processing is immediately carried out.

The substrate 3 may be subjected t o the measurement of the sheet resistance immediately after the removal of the substrate 3 from the load-lock chamber 1 of the thin-film depositing apparatus, without providing the above-mentioned air-cooling period. In this case, however, there is a possibility that the substrate 3 is warped because of high temperatures. In order to measure the sheet resistance without being affected by the warp of the substrate 3, it is preferred that the sensor head 16 is mounted in the proximity of the suction pad 15. Namely, even when the substrate 3 is warped, since the distance between the substrate 3 and the holding plane of the robot arm 5 is uniform at a position where the substrate 3 is adhered to the suction pad 16, if the sensor head 16 is positioned in the proximity of the suction pad 15, the distance between the substrate 3 and the sensor head 16 is also substantially uniform, thereby ensuring a stable measurement. Furthermore, when the sensor head 16 is positioned in the center of the suction pads 15 if possible dimensionally, the sheet resistance can be measured in a more stable manner.

Embodiment 4

Figure 7:
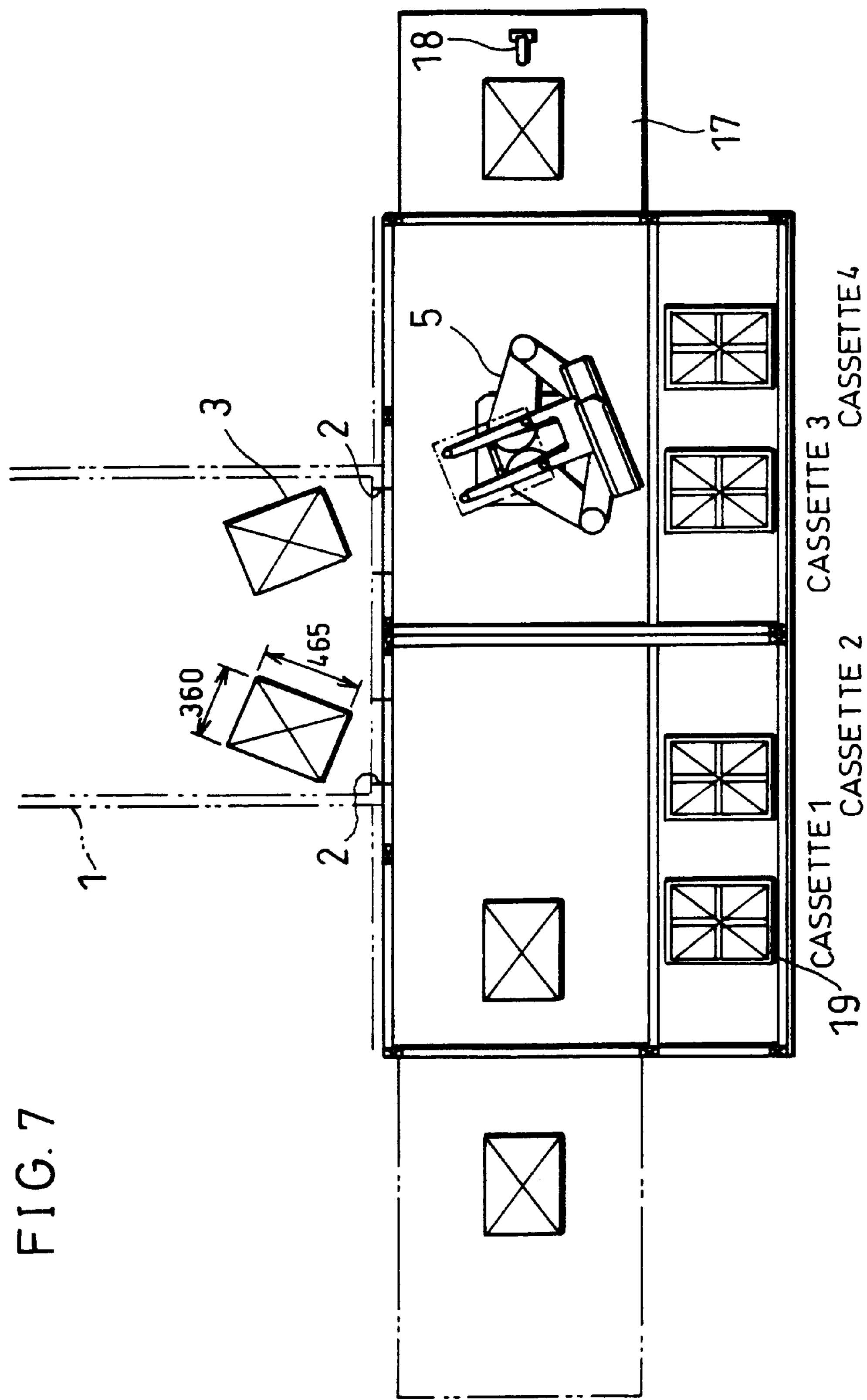
FIG. 7 is a plan view of a thin-film depositing apparatus according to another embodiment of the present invention, wherein a stage for measuring the sheet resistance of a substrate is provided.

A thin-film depositing apparatus according to the fourth embodiment has almost the same structure as the thin-film depositing apparatus of the first embodiment. However, in the thin-film depositing apparatus of the fourth embodiment, the measuring device using the eddy current method is not mounted in the proximity of the substrate outlet 2 of the load-lock chamber 1. More specifically, as illustrated in FIG. 7, the substrate 3 removed from the load-lock chamber 1 by the robot arm 5 is once transported onto a sheet-resistance measuring stage (suction stage) 17 where the sheet resistance is measured by a measuring device (sheet-resistance measuring means) 18. In this embodiment, the measuring device 18 is a double-side measuring device using the eddy current method. The substrate 3 which has undergone the measurement of the sheet resistance is stored in an unloader cassette section 19.

Figure 8:
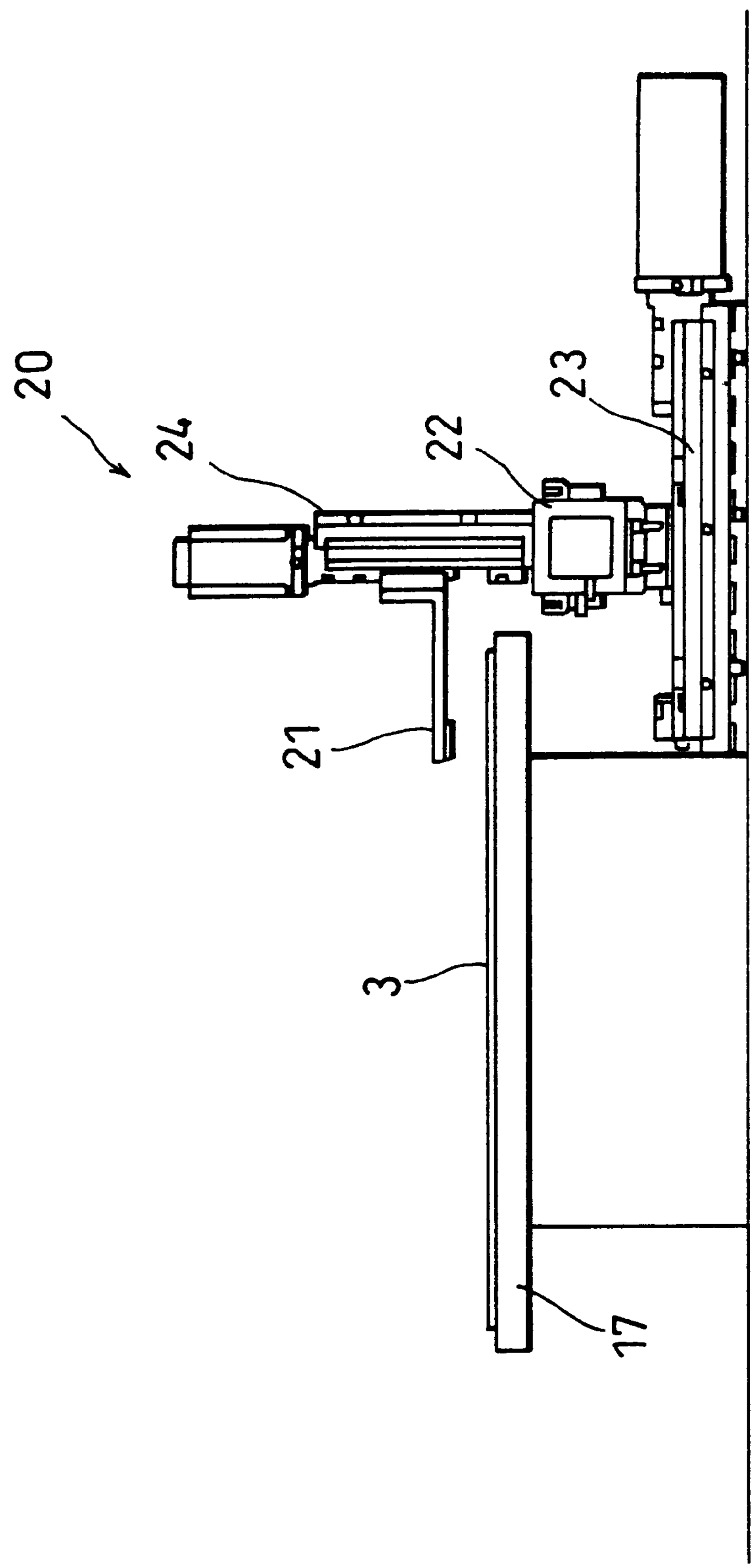
FIG. 8 is a side view showing a mechanism for measuring the sheet resistance of a substrate placed on the stage.

Additionally, in a modified example shown in FIG. 8, a suction pad (not shown) is provided on the sheet-resistance measuring stage 17, and the sheet resistance measurement is performed with respect to the substrate 3 fixed to the sheet-resistance measuring stage 17 by suction with the use of a one-side measuring device using the eddy current method (sheet-resistance measuring means) 20. In this case, a sensor head 21 of the measuring device using the eddy current method 20 is fastened to an X-axis moving stage 22, a Y-axis moving stage and a Z-axis moving stage, and movable in the directions along the three axes. Namely, even when the substrate 3 is being vibrated, the sensor head 21 can maintain a uniform distance between the substrate 3 and the sensor head 21 itself by its movement in a direction along the Z-axis, and measure the sheet resistance without being affected by the vibration of the substrate 3. Moreover, the sensor head 21 can measure the sheet resistance at a plurality of points on the substrate 3 with its movements in directions along the X-axis and Y-axis.

Meanwhile, in the double-side measuring device using the eddy current method 18, since a support can not be provided under the substrate 3, it is necessary to provide a groove on the sheet-resistance measuring stage 17. Besides, in order to perform measurements at a corner section and a center section, the sheet-resistance measuring stage 17 needs to have a complicated shape. However, when the one-side measuring device using the eddy current method 20 is adopted, only the upper surface of the substrate 3 is measured, and therefore the sheet-resistance measuring stage 17 does not require a complicated structure.

Embodiment 5

Figure 9:
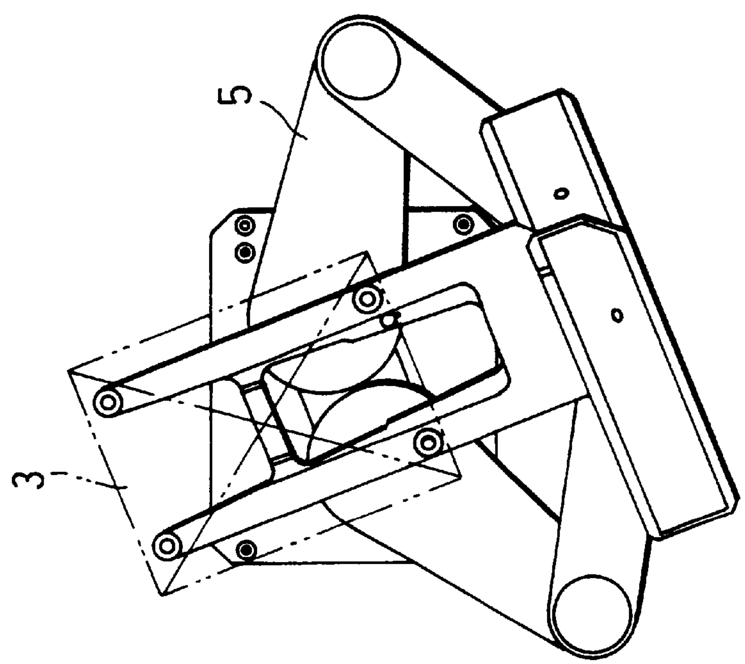
FIG. 9 is a plan view showing a part of the thin-film depositing apparatus, wherein the sensor head of the measuring device using the eddy current method is buried in the stage.
Figure 9:
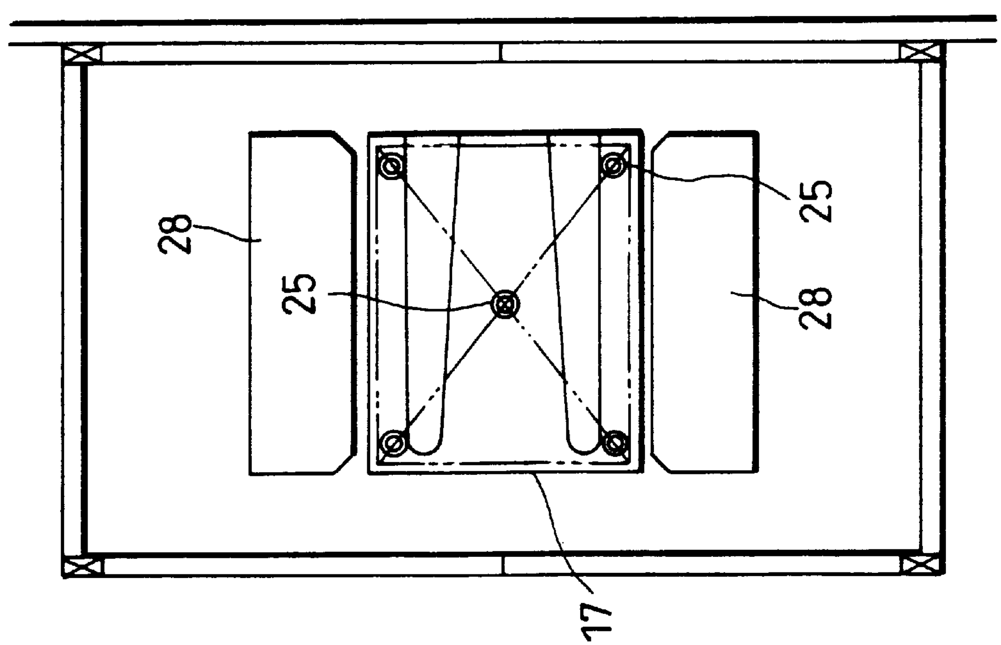

A thin-film depositing apparatus according to the fifth embodiment has almost the same structure as the thin-film depositing apparatus of the first embodiment. However, in the thin-film depositing apparatus of the fifth embodiment, the measuring device using the eddy current method is not mounted in the proximity of the substrate outlet 2 of the load-lock chamber 1. More specifically, as illustrated in FIG. 9, the substrate 3 removed from the load-lock chamber 1 by the robot arm 5 is once transported to the sheet-resistance measuring stage 17 where the sheet resistance is measured. After the measurement of the sheet resistance, the substrate 3 is stored in the unloader cassette section 19.

Figure 10:
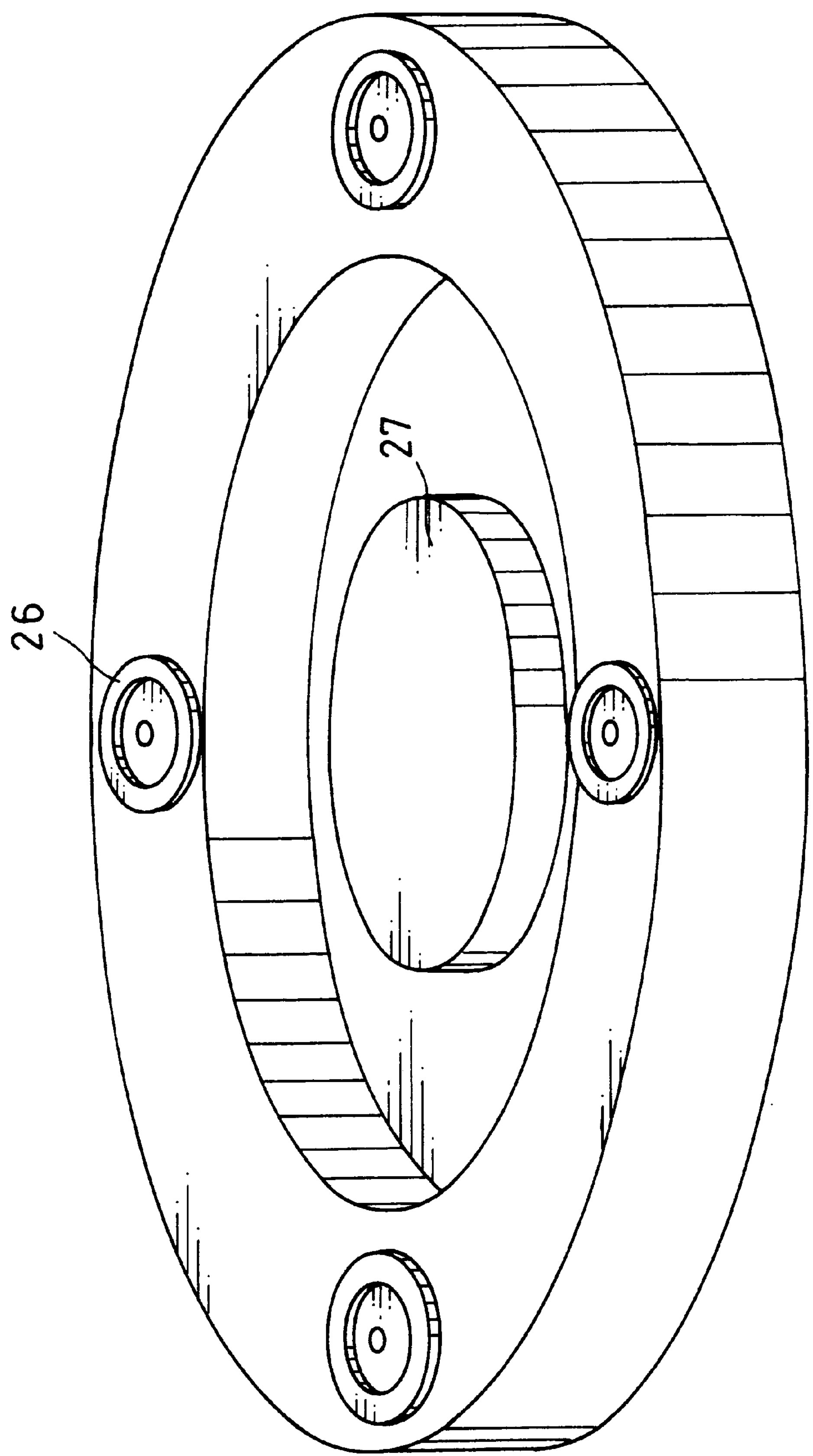
FIG. 10 is an enlarged perspective view showing a state in which the sensor head is buried in the center of substrate suction sections of the stage.

One-side measuring device using the eddy current method (sheet-resistance measuring means) 25 is buried under a holding plane of the sheet-resistance measuring stage 17 whereupon the substrate 3 is to be held, so that the sheet resistance of the substrate 3 held on the holding plane is measured. As illustrated in FIG. 10, the measuring device using the eddy current method 25 includes a plurality of suction pads (suction sections) 26 for adhering the substrate 3 thereto, and a sensor head 27 disposed at the center of these suction pads 26. Therefore, even when the substrate 3 is warped, the distance between the sensor head 27 and the substrate 3 is substantially uniform at a point where the sheet resistance is measured by the sensor head 27 due to the suction pads 26, thereby allowing a stable measurement.

Figure 11:
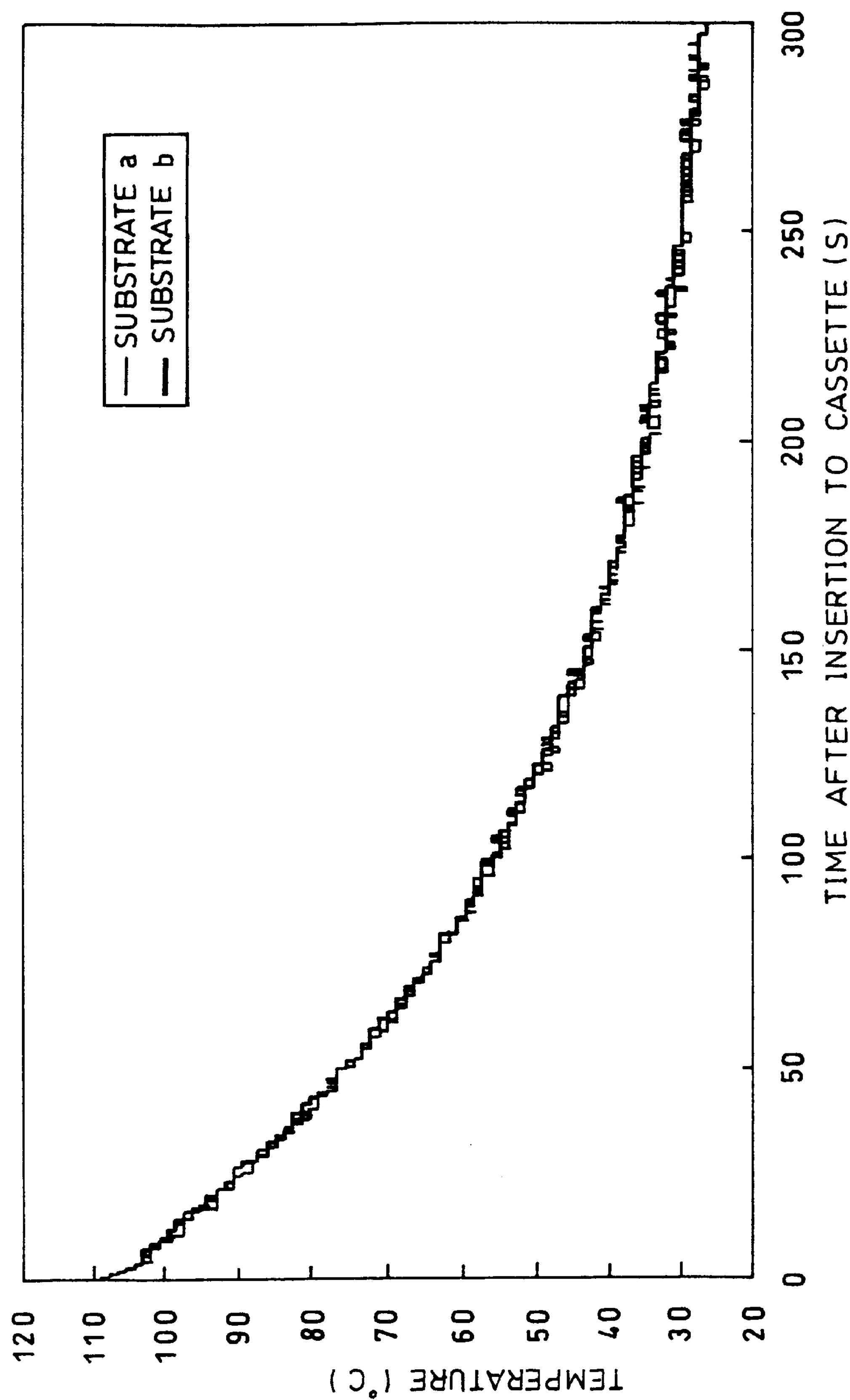
FIG. 11 is a graph showing the results of measuring the changes in the temperature of the substrate having a thin film deposited thereon, with time.

Moreover, in order to achieve stable results of the sheet resistance measurements, it is preferred that the difference in temperature between the sensor head 27 and the substrate 3 is uniform. It is therefore arranged that the substrate 3 is cooled down to a predetermined temperature by an air-cooler 28 and then subjected to the measurement of the sheet resistance. Furthermore, as illustrated in FIG. 11, it was confirmed that, even when air-cooler was not used, the temperature of the substrate 3 was lowered to a temperature which does not affect the sheet resistance in five minutes. Hence, it is possible to provide a five-minute air-cooling period instead of using the air-cooler 28.

Thus, by measuring and managing the sheet resistances at the center section and the corner section of the substrate 3 when the temperature of the substrate 3 is lowered to a temperature which does not affects the sheet resistance, it is possible to manage unexpected defects and achieve an improved yield.

Embodiment 6

Figure 12:
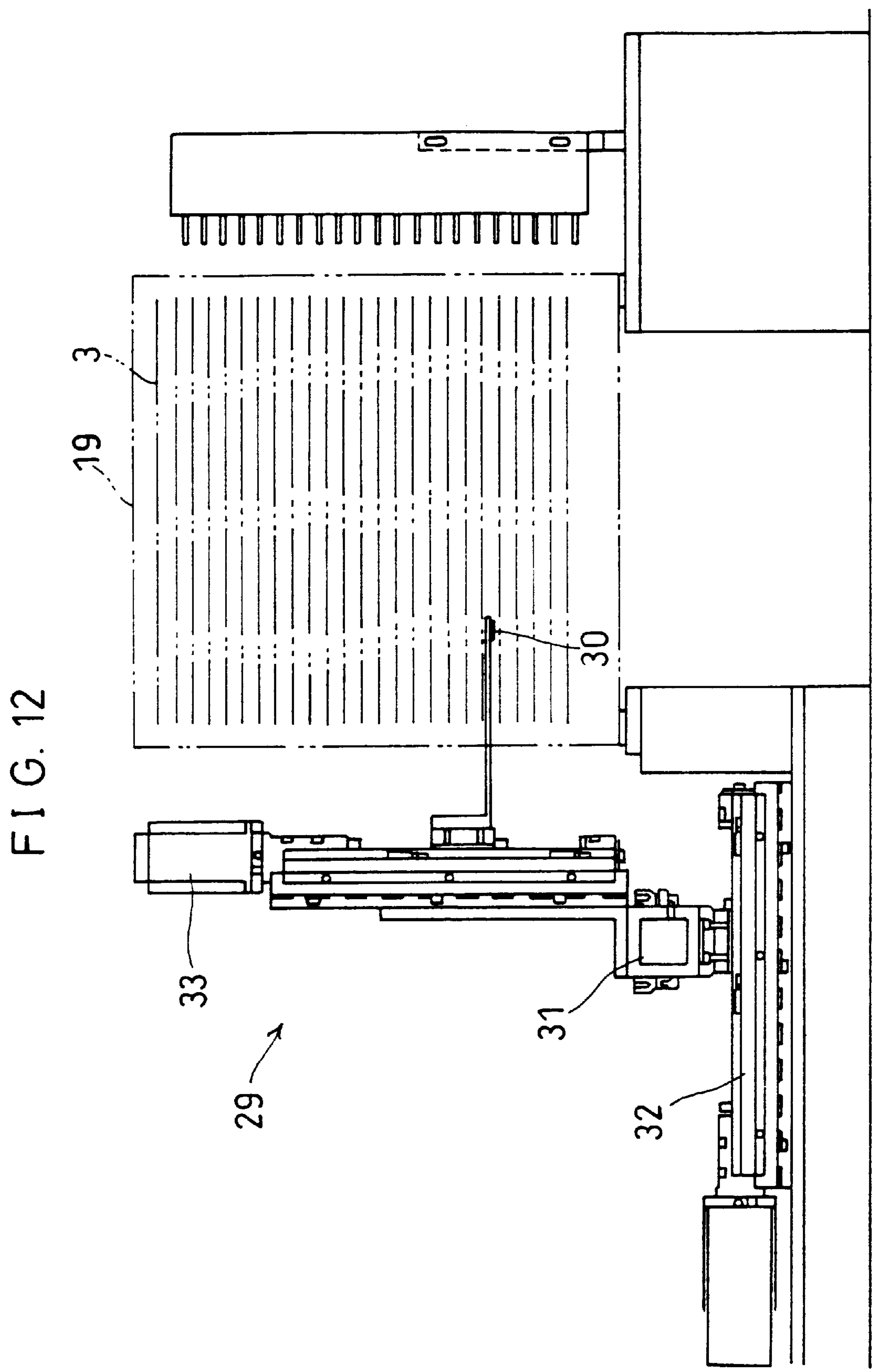
FIG. 12 is a side view showing a part of a thin-film depositing apparatus according to another embodiment, wherein a one-side measuring device using the eddy current method is provided in the proximity of an unloader cassette section.

A thin-film depositing apparatus according to the sixth embodiment has almost the same structure as the thin-film depositing apparatus of the first embodiment. However, in the thin-film depositing apparatus of the sixth embodiment, the measuring device using the eddy current method is not mounted in the proximity of the substrate outlet 2 of the load-lock chamber 1. More specifically, as illustrated in FIG. 12, the substrate 3 removed from the load-lock chamber 1 by the robot arm 5 is stored in the unloader cassette section 19. A measuring device using the eddy current method (sheet-resistance measuring means) 29 for measuring the sheet resistance of the sputtered film on the substrate 3 is disposed adjacent to the unloader cassette section 19, and measures the sheet resistance of the substrate 3 stored in the unloader cassette section 19.

The measuring device using the eddy current method 29 includes a sensor head 30, an X-axis moving stage 31, a Y-axis moving stage 32, and a Z-axis moving stage 33. The sensor head 30 is fastened to the X-axis moving stage 31, Y-axis moving stage 32 and Z-axis moving stage 33, and movable in the directions along the three axes. Namely, even when the substrate 3 is being vibrated, the sensor head 30 can maintain a uniform distance between the substrate 3 and the sensor head 30 itself with its movement in a direction along the Z-axis, and measure the sheet resistance without being affected by the vibration of the substrate 3. Moreover, the sensor head 30 can measure the sheet resistance at a plurality of points on the substrate 3 with its movements in directions along the X-axis and Y-axis.

Furthermore, in this embodiment, in order to measure the sheet resistance of the substrate 3 stored in the cassette, it is preferred that the measuring device using the eddy current method 29 is a singleside measuring device using the eddy current method, which is capable of monitoring the sheet resistance by inserting the sensor head 30 into a space between the substrates 3 where the sheet resistance is not measurable by the four point probe method or the bothside type eddy current method.

Figure 13:
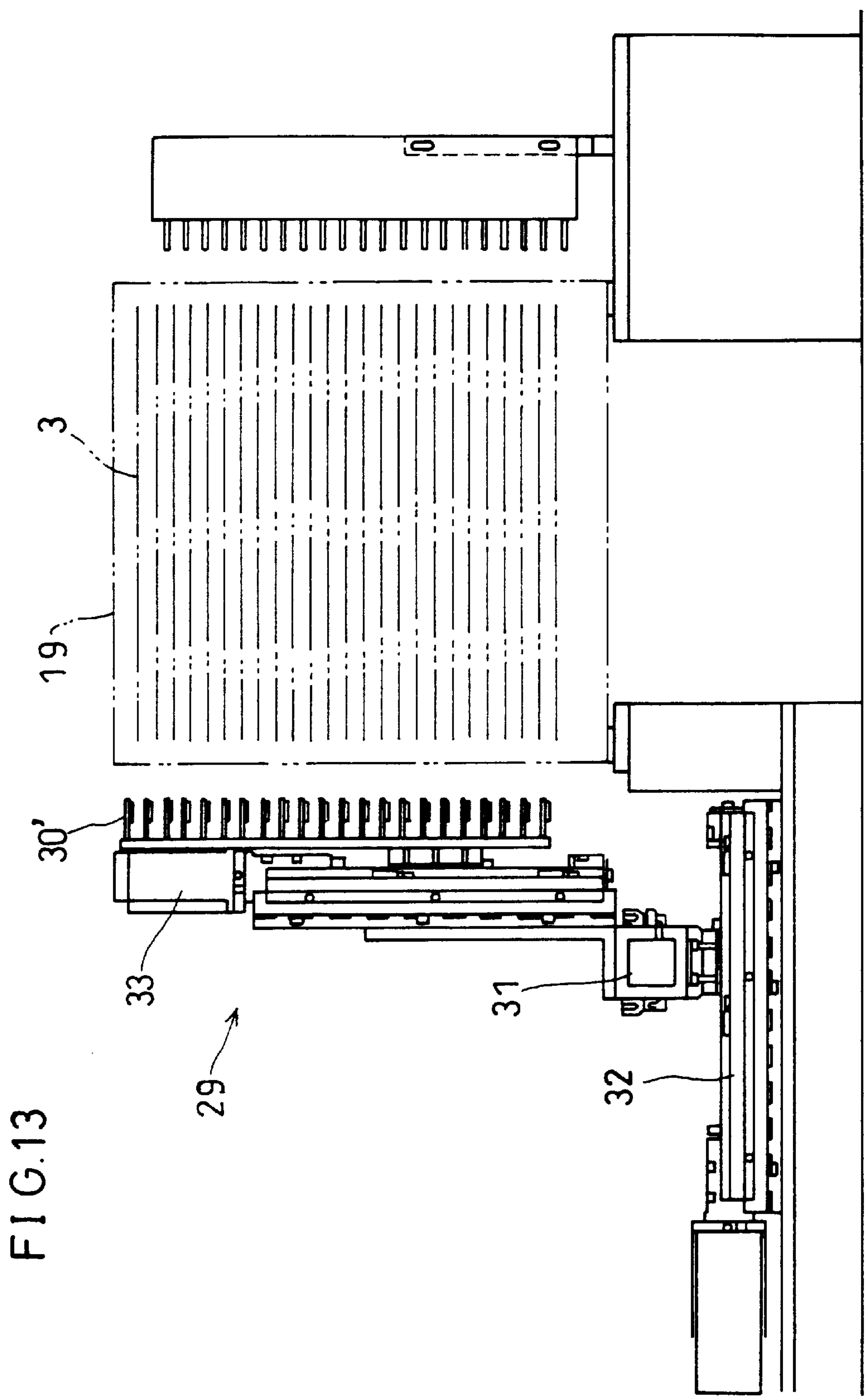
FIG. 13 is a side view showing a part of a thin-film depositing apparatus as a modified example of FIG. 12, wherein the measuring device using the eddy current method includes plural layers of sensor heads.

Besides, in the measuring device using the eddy current method 29 shown in FIG. 12, since only one sensor head 30 is provided, the sheet resistance of one substrate 3 is measured at a time. However, in order to enable the sheet resistance measurement by measuring a plurality of the substrates 3 at a time, a plurality of sensor heads 30' may be provided as shown in FIG. 13.

As explained in the above-mentioned embodiments, in a thin-film depositing apparatus according to the present invention, since a measuring device using the eddy current method is disposed outside of a load-lock chamber where the temperature is controlled by a heater, etc., it is possible to measure the sheet resistance in a stable manner without the electromagnetic or thermal influence of the heater, etc.

Moreover, the sheet resistance measured by the measuring device using the eddy current method is immediately output to the CIM system, and the next film deposition conditions are determined by the data of the sheet resistance, if necessary. When the sheet resistance is an abnormal value, processes such as a confirmation and an apparatus operation control, are carried out immediately. Therefore, compared with a conventional structure in which the film deposition conditions are controlled by measuring the sheet resistance randomly by the four point probe method, the present invention can manage unexpected defects and variations in the film thickness more appropriately, and achieve an improved yield without lowering the thruput.

In the above-described embodiments, when there is a variation in the temperature of the substrate in measuring the sheet resistance by the measuring device using the eddy current method, the variation in the temperature appears as a variation in the sheet resistance measured. In the above explanation, therefore, the sheet resistance is measured after lowering the temperature of the substrate to around room temperature. However, if temperature measuring means for measuring the temperature of the substrate is provided together with the measuring device using the eddy current method, even when the temperature of the substrate is varied, it is possible to manage the sheet resistance measurement correctly by taking the data of the correlation between the temperature and the sheet resistance in advance.

Moreover, when an infrared radiation type temperature measuring device is used as the temperature measuring means to measure the temperature of the substrate by irradiating infrared rays from the back surface of the substrate, a thin film having a mirror finished surface such as aluminum and tantalum, i.e., a thin film of a material whose temperature is difficult to measure due to its low emissivity, it is possible to approximately measure the temperature of the thin film by measuring the glass temperature from the back surface of the substrate.

Figure 15:
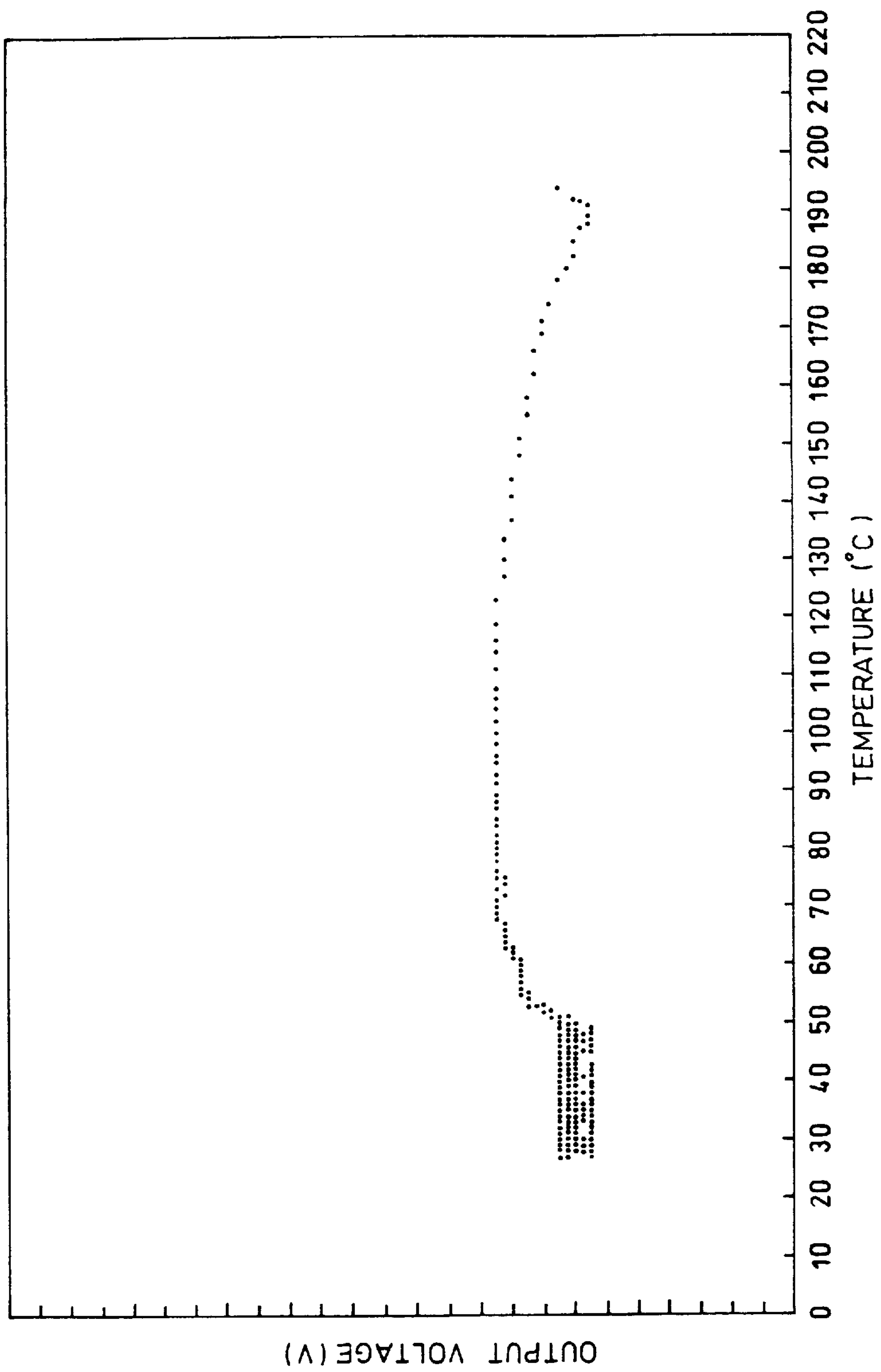
FIG. 15 is a graph showing the relationship between the voltage output of the measuring device using the eddy current method and the temperature when a ceramic as a material which is not apt to conduct heat is used for the sensor head.
Figure 23:
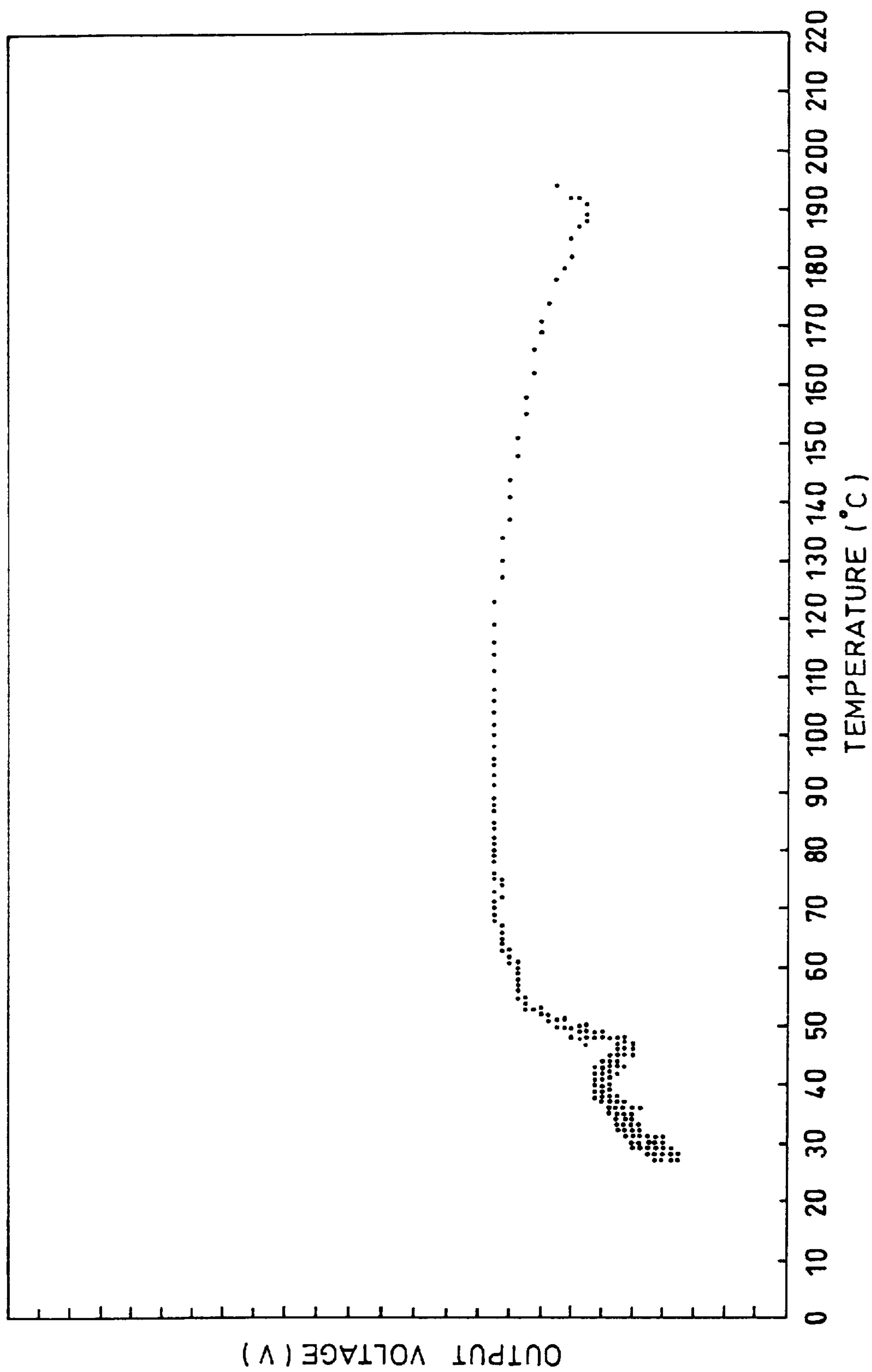
FIG. 23 is a graph showing the relationship between the voltage output of the measuring device using the eddy current method and the temperature obtained according to the results shown in FIG. 22.

Additionally, in each of the embodiments, it is preferred that the sensor head used in the measuring device using the eddy current method is produced from a material which is not likely to be influenced by thermal radiation. For example, in order to precisely measure the sheet resistance in a non-contact manner, the measuring device using the eddy current method needs to be moved as close as possible to the substrate. In this case, the output value varies considerably during the movement of the measuring device using the eddy current method because of the coil expansion, etc. caused by the thermal effect from the substrate. However, if a ceramic which is not apt to conduct heat is used for the sensor head, it is possible to limit the expansion of the ferrite core coil incorporated in the sensor head and reduce the changes in the coil characteristics due to heat, such as the change in the magnetic permeability of core and the change in the magnetic flux. It is thus possible to provide a more stable sheet resistance at temperatures of not more than 50° C. as shown in FIG. 15 compared with the case shown in FIG. 23. Additionally, the sensor head may be covered with MC nylon of a thickness between 0.3 mm and 0.5 mm.

Besides, in each of the above-described embodiments, a non-contact measuring device using the eddy current method is used as the sheet-resistance measuring means. However, if there is no problem in respect of the arrangement, it is possible to use sheet-resistance measuring means employing the four point probe method. Even when the sheet-resistance measuring means employing the four point probe method is provided, if this sheet-resistance measuring means is disposed in the load-lock chamber, the sheet resistance can not be measured in a stable manner due to the thermal effect. Thus, when the thermal effect is reduced by disposing the sheet-resistance measuring means outside of the load-lock chamber, the sheet resistance can be measured in a more stable manner.

As described above, a first thin-film depositing apparatus according to the present invention deposits a thin metal film on a substrate in a vacuum container, removes the substrate having the thin metal film deposited thereon from the vacuum container through a load-lock chamber, measures the sheet resistance of the thin metal film deposited on the substrate by sheet-resistance measuring means, and controls the thickness of the thin metal film according to the measurement value, wherein the sheet-resistance measuring means is disposed outside of the load-lock chamber.

For instance, in the case where sheet-resistance measuring means employing the eddy current method is used, it is preferred that the difference in temperature between the sensor head of the sheet-resistance measuring means and the substrate subjected to the sheet resistance measurement is uniform. However, as in a conventional structure, if the temperature control is performed with the sheet-resistance measuring means disposed in the load-lock chamber, the sheet resistance measurement is influenced by the electromagnetic or thermal effect of a heater, etc.

However, according to the above-mentioned structure, since the sheet-resistance measuring means is disposed outside of the load-lock chamber, the sheet-resistance measuring means is not influenced by the heater, etc. in the load-lock chamber, thereby enabling a stable sheet resistance measurement. Moreover, since the sheet-resistance measuring means is disposed outside of the load-lock chamber, the maintenance efficiency is improved.

Furthermore, in the case where the sheet-resistance measuring means employs the four point probe method, if the sheet-resistance measuring means is disposed in the load-lock chamber, the thermal effect is present. Thus, by positioning the sheet-resistance measuring means outside of the load-lock chamber, the sheet resistance can be measured in a stable manner.

In addition to the structure of the first thin-film depositing apparatus, a second thin-film depositing apparatus according to the present invention is arranged such that the sheet-resistance measuring means is disposed in the proximity of a substrate outlet of the load-lock chamber.

According to this structure, since the sheet-resistance measuring means is disposed in the proximity of the substrate outlet of the load-lock chamber, it is possible to measure the sheet-resistance when the substrate is removed from the load-lock chamber.

Thus, this structure does not cause an increase in the size of the thin-film depositing apparatus, and enables an effective use of a clean room which has a limitation in terms of the available space. Moreover, according to this structure, it is possible to add the sheet resistance monitoring system in an apparatus which has a limitation in the installation space or an apparatus used for production. Furthermore, this structure does not require substantial changes in the movements of the transport robot and the cassette, enables a reduction in the space, requires no excess space within the apparatus, and achieves the sheet resistance monitoring system without adding an excessive movement of the robot.

In addition to the structure of the first thin-film depositing apparatus, a third thin-film depositing apparatus according to the present invention is arranged such that the sheet-resistance measuring means is a sensor head of a measuring device using the eddy current method which is buried under a substrate holding plane of a robot arm for transporting the substrate.

According to this structure, since the sheet-resistance measuring means is buried under the substrate holding plane of the robot arm for transporting the substrate, the size of the thin-film depositing apparatus is not increased and a clean room which has a spatial limitation can be used effectively. Moreover, with this structure, it is possible to easily design a sheet resistance monitoring system for a current thin-film depositing apparatus.

In addition to the structure of the first thin-film depositing apparatus, a fourth thin-film depositing apparatus according to the present invention is arranged such that the sheet-resistance measuring means includes a suction stage for holding thereon a substrate subjected to a sheet resistance measurement.

In addition to the structure of the fourth thin-film depositing apparatus, a fifth thin-film depositing apparatus according to the present invention is arranged such that the sheet-resistance measuring means measures the sheet resistance by a sensor head of a measuring device using the eddy current method which is buried under the substrate holding plane of the suction stage.

In addition to the structure of the fourth thin-film depositing apparatus, a sixth thin-film depositing apparatus according to the present invention is arranged such that the sheet-resistance measuring means measures the sheet resistance with a one-side measuring device using the eddy current method which is disposed in the proximity of the suction stage so that its single sensor head faces the substrate.

According to the structures of the fourth to sixth thin-film depositing apparatuses, since the sheet-resistance measuring means includes the suction stage, the warp of the substrate is diminished when the substrate is adhered to the suction stage and the sheet resistance measurement is not affected by the sensor gap dependence due to the influence of the warp. Furthermore, if the sheet resistance is measured after decreasing the temperature of the substrate on the suction stage, it is possible to obtain a stable sheet resistance without being influenced by the substrate temperature.

Furthermore, according to the structure of the fifth thin-film depositing apparatus, by burying the sensor head under the necessary measurement point of the substrate, it is possible to simplify the complicated mechanism. Additionally, by burying a plurality of sensor heads at each of desired measuring points, the sheet resistance distribution can be managed accurately.

In addition to the structure of the first thin-film depositing apparatus, a seventh thin-film depositing apparatus according to the present invention is arranged such that the sheet-resistance measuring means is disposed adjacent to an unloader cassette section for storing a substrate with a thin metal film formed thereon.

According to this structure, since there is no need to provide a stage only for the measurement of the sheet resistance of the substrate, a sheet resistance monitoring system can be provided without increasing the space. Additionally, since the sheet resistance is measured in a state in which the substrate is stored in the unloader cassette section, it is possible to provide a stable sheet resistance without being influenced by the vibration of the robot arm for transporting the substrate.

In addition to the structure of any one of the first, second and seventh thin-film depositing apparatuses, an eighth thin-film depositing apparatus according to the present invention is arranged such that the sheet-resistance measuring means is formed by a double-side measuring device using the eddy current method for measuring the sheet resistance of the substrate by inserting the substrate between two opposing sensor heads.

According to this structure, it is possible to control the film deposition conditions in single wafer processing by monitoring the sheet resistance without using the four point probe method, so that the substrate is not scratched nor contaminated.

In addition to the structure of the eighth thin-film depositing apparatuses, a ninth thin-film depositing apparatus according to the present invention is arranged such that the sheet-resistance measuring means allows the gap between the sensor heads to be varied.

In a thin-film depositing apparatus of a single wafer processing type, it is often the case that the substrate having a film deposited thereon is warped because of high temperatures. Therefore, it happened that the resistance varied depending on the measuring height between the sensor heads and unexpected defects of within ±5% were not managed. However, according to the structure of the ninth thin-film depositing apparatus, since the gap between the sensor heads is variable, it is possible to maintain a uniform measuring height, thereby achieving a stable sheet resistance measurement.

In addition to the structure of any one of the first, second and seventh thin-film depositing apparatuses, a tenth thin-film depositing apparatus according to the present invention is arranged such that the sheet-resistance measuring means is formed by a one-side measuring device using the eddy current method for measuring the sheet resistance of the substrate by positioning a single sensor head to face the substrate.

According to this structure, since the one-side measuring device using the eddy current method is used as the sheet-resistance measuring means, it is possible to achieve a more compact apparatus requiring a less space compared with the case where a double-side measuring device employing the eddy current method is used.

In addition to the structure of the sixth or tenth thin-film depositing apparatus, an eleventh thin-film depositing apparatus according to the present invention is arranged such that the sensor head is movable at least in a direction of the thickness of the substrate.

In a thin-film depositing apparatus of a single wafer processing type, since the vibration of the substrate transporting robot is transmitted to the substrate, it is necessary to wait for the attenuation of the vibration in order to measure the sheet resistance of the substrate. However, with the above-mentioned structure, it is possible to eliminate the time for waiting the attenuation of the vibration by driving the sensor head in a direction of the thickness of the substrate, measure the sheet resistance without making the tact time longer, and control the film deposition conditions efficiently.

In addition to the structure of the sixth or tenth thin-film depositing apparatus, a twelfth thin-film depositing apparatus according to the present invention is arranged such that the sensor head is movable at least in a direction of an axis in the plane of the substrate by the driving means.

With this structure, it is possible to measure the sheet resistance at a plurality of points by moving the sensor head along a direction in the plane of the substrate.

In addition to the structure of the third or fifth thin-film depositing apparatus, a thirteenth thin-film depositing apparatus according to the present invention is arranged such that the sensor head is mounted at the center of the suction sections for fixing the substrate onto the substrate holding plane by suction.

With this structure, since the sensor head is buried under the substrate holding plane at the center of the substrate suction sections, it is not affected by a slight warp of the substrate. Therefore, with this structure, a more stable sheet resistance can be obtained.

In addition to the structure of any one of the first to thirteenth thin-film depositing apparatus, a fourteenth thin-film depositing apparatus according to the present invention is arranged such that the sensor head of the sheet-resistance measuring means is produced from a material which is not apt to be influenced by thermal radiation.

With this structure, when a material such as ceramics which are not apt to conduct heat is used for the sensor head, it is possible to reduce the expansion of a ferrite core coil, etc. included in the sensor head due to heat and the changes in the coil characteristics due to heat, such as the change in the magnetic permeability of core and the change in the magnetic flux, thereby limiting the variation in the measurement value of the sheet resistance caused by the thermal effect. Thus, in contrast to a conventional structure where the substrate temperature needs to be lowered to around room temperature to obtain a stable sheet resistance, it is possible to achieve a stable sheet resistance at temperatures of not higher than 50° C.

In addition to the structure of any one of the first to fourteenth thin-film depositing apparatuses, a fifteenth thin-film depositing apparatus according to the present invention includes temperature measuring means for measuring the temperature of the substrate in measuring the sheet resistance of the substrate by the sheet-resistance measuring means.

With this structure, since the temperature measuring means for measuring the temperature of the substrate is provided, even when the temperature of the substrate varies, an accurate management can be carried out by taking the data of the correlation between the substrate temperature and the sheet resistance.

In addition to the structure of the fifteenth thin-film depositing apparatus, a sixteenth thin-film depositing apparatus according to the present invention is arranged such that the temperature measuring means is an infrared radiation type temperature measuring device for measuring the temperature of the substrate by irradiating infrared rays on the back surface of the substrate.

With this structure, since the temperature of the substrate is measured by irradiating infrared rays on the back surface of the substrate, the temperature of a thin film having a mirror finished surface such as aluminum and tantalum, i.e., a thin film of a material whose temperature is difficult measure due to its low emissivity, can be measured approximately by measuring the glass temperature from the back surface of the substrate.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin-film depositing apparatus comprising:

a thin-film depositing chamber for depositing a thin metal film on a substrate;

a load-lock chamber for taking the substrate out of said apparatus without exposing said thin-film depositing chamber to atmosphere;

resistance measuring means, disposed outside of said load-lock chamber without being housed, for measuring a resistance of the thin metal film on the substrate taken out through said load-lock chamber; and controlling means for controlling a thin film deposition in said thin-film depositing chamber according to the measured resistance so that a thin metal film with a target thickness is deposited on a next substrate.

2. The thin-film depositing apparatus as set forth in claim 1, wherein the substrate having the thin metal film deposited thereon is removed through a substrate outlet of said load-lock chamber, and said resistance measuring means is arranged so that the resistance is measured on a path along which the substrate is removed through said substrate outlet.

3. The thin-film depositing apparatus as set forth in claim 1, further comprising removing means for removing the substrate through a substrate outlet of said load-lock chamber, wherein said resistance measuring means measures the resistance for the substrate removed by said removing means.

4. The thin-film depositing apparatus as set forth in claim 3, wherein said resistance measuring means is a measuring device using an eddy current method with at least one sensor head which is disposed in said removing means to face the thin metal film on the substrate.

5. The thin-film depositing apparatus as set forth in claim 4, wherein said removing means is a robot arm having a plane for holding the substrate thereon, and said at least one sensor head is buried under the plane.

6. The thin-film depositing apparatus as set forth in claim 3, wherein said resistance measuring means is a measuring device using an eddy current method with two opposing sensor heads, for measuring the resistance of the thin metal film deposited on the substrate when the substrate is placed between the two sensor heads.

7. The thin-film depositing apparatus as set forth in claim 6, wherein the distance between said two sensor heads is variable.

8. The thin-film depositing apparatus as set forth in claim 7, further comprising first moving means for moving said sensor heads in a direction horizontal to the thin metal film.

9. The thin-film depositing apparatus as set forth in claim 4, wherein said removing means is a robot arm having a plane for holding the substrate thereon, and said at least one plane includes thereon said sensor head and a plurality of suction sections for adhering the substrate thereto by suction.

10. The thin-film depositing apparatus as set forth in claim 9, wherein said sensor head is disposed in proximity of the suction section.

11. The thin-film depositing apparatus as set forth in claim 8, further comprising second moving means for moving one of said sensor heads in a direction perpendicular to the thin metal film.

12. The thin-film depositing apparatus as set forth in claim 1, further comprising temperature measuring means for measuring the temperature of the substrate, wherein said resistance measuring means measures the resistance of the thin metal film deposited on the substrate in light of the temperature measured by said temperature measuring means.

13. The thin-film depositing apparatus as set forth in claim 12, wherein said temperature measuring means is an infrared radiation temperature measuring device for measuring the temperature of the substrate by irradiating infrared rays on a back surface of the substrate.

14. The thin-film depositing apparatus as set forth in claim 4, wherein said at least one sensor head is made from a material having a small thermal conductivity.

15. A thin-film depositing apparatus comprising:

a vacuum container for depositing a thin metal film on a substrate;

a load-lock chamber through which a substrate having a thin metal film deposited thereon is removed from said vacuum container;

sheet-resistance measuring means for measuring a sheet resistance of the thin metal film on the substrate, said sheet-resistance measuring means being disposed outside of said load-lock chamber without being housed; and controlling means for controlling a thin film deposition in said vacuum container according to the measured sheet resistance so that a thin metal film with a target thickness is deposited on a next substrate.

16. The thin-film depositing apparatus as set forth in claim 15, wherein said load-lock chamber includes a substrate outlet through which the substrate is removed; and said sheet-resistance measuring means is disposed in proximity of said substrate outlet.

17. The thin-film depositing apparatus as set forth in claim 15, further comprising a robot arm for removing the substrate, the robot arm having a plane for holding thereon the substrate subjected to a sheet resistance measurement, wherein said sheet-resistance measuring means is a measuring device using an eddy current method and buried under the plane.

18. The thin-film depositing apparatus as set forth in claim 15, wherein said sheet-resistance measuring means includes a suction stage for holding thereon the substrate subjected to a sheet resistance measurement.

19. The thin-film depositing apparatus as set forth in claim 18, wherein said sheet-resistance measuring means is a measuring device using an eddy current method and buried under a plane of the suction stage.

20. The thin-film depositing apparatus as set forth in claim 18, wherein said sheet-resistance measuring means is a one-side measuring device using an eddy current method with a single sensor head, and disposed in proximity of said suction stage, and said sensor head is positioned to face the substrate subjected to the sheet resistance measurement.

21. The thin-film depositing apparatus as set forth in claim 15, wherein said sheet-resistance measuring means is disposed in proximity of an unloader cassette section for storing substrates with thin metal films deposited thereon.

22. The thin-film depositing apparatus as set forth in claim 21, wherein said sheet-resistance measuring means is a measuring device using an eddy current method with a plurality of sensor heads for measuring concurrently resistances of the thin films on a plurality of the substrates contained in said unloader cassette section.

23. The thin-film depositing apparatus as set forth in claim 15, wherein said sheet-resistance measuring means is a double-side measuring device using an eddy current method with opposing two sensor heads, and the substrate subjected to a sheet resistance measurement is placed between said sensor heads.

24. The thin-film depositing apparatus as set forth in claim 23, wherein at least one of said sensor heads is movable with respect to the other sensor head, and wherein the distance between the substrate placed between the two sensor heads and each of said sensor heads is maintained to be a target distance.

25. The thin-film depositing apparatus as set forth in claim 24, further comprising a substrate detecting sensor for detecting the distance, wherein said one of said sensor heads is moved so that the distance detected by the substrate detecting sensor is equal to a target distance.

26. The thin-film depositing apparatus as set forth in claim 25, wherein said substrate detecting sensor is a laser displacement sensor for detecting the distance between the substrate placed between the sensor heads and each of the sensor heads by irradiating a laser beam on the substrate placed between the sensor heads.

27. The thin-film depositing apparatus as set forth in claim 15, wherein said sheet-resistance measuring means is a one-side measuring device using an eddy current method with a single sensor head, and said sensor head is disposed to face the substrate subjected to a sheet resistance measurement.

28. The thin-film depositing apparatus as set forth in claim 20, wherein said sensor head is movable in a direction of a thickness of the thin metal film on the substrate subjected to a sheet resistance measurement.

29. The thin-film depositing apparatus as set forth in claim 27, wherein said sensor head is movable in a direction of a thickness of the thin metal film on the substrate subjected to a sheet resistance measurement.

30. The thin-film depositing apparatus as set forth in claim 20, wherein said sensor head is movable at least in a direction of one axis in a plane of the substrate subjected to a sheet resistance measurement.

31. The thin-film depositing apparatus as set forth in claim 27, wherein said sensor head is movable at least in a direction of one axis in a plane of the substrate subjected to a sheet resistance measurement.

32. The thin-film depositing apparatus as set forth in claim 17, further comprising a plurality of suction sections for fixing by suction the substrate which is placed on said plane for a sheet resistance measurement, wherein said measuring device using the eddy current method is disposed at substantially the center of said plurality of suction sections.

33. The thin-film depositing apparatus as set forth in claim 19, further comprising a plurality of suction sections for fixing by suction the substrate which is placed on said plane for a sheet resistance measurement, wherein said measuring device using the eddy current method is disposed at substantially the center of said plurality of suction sections.

34. The thin-film depositing apparatus as set forth in claim 17, further comprising a plurality of suction sections for fixing by suction the substrate which is placed on said plane for a sheet resistance measurement, wherein said measuring device using the eddy current method is disposed in proximity of said plurality of suction sections.

35. The thin-film depositing apparatus as set forth in claim 15, wherein said sheet-resistance measuring means measures the resistance of the thin film on the substrate subjected to a sheet resistance measurement through a sensor head made from a material which is not apt to be affected by thermal radiation.

36. The thin-film depositing apparatus as set forth in claim 15, further comprising temperature measuring means for measuring a temperature of the substrate having the thin film deposited thereon, wherein the sheet resistance measurement, and the measurement of the temperature of the substrate subjected to the sheet resistance measurement by said temperature measuring means are carried out concurrently.

37. The thin-film depositing apparatus as set forth in claim 36, wherein said temperature measuring means is an infrared radiation temperature measuring device, and measures the temperature of the substrate subjected to the sheet resistance measurement by irradiating infrared rays on a surface of the substrate on which surface no thin film is deposited.

38. A thin-film depositing apparatus comprising:

a thin-film depositing chamber for depositing a thin metal film on a substrate;

a load-lock chamber for taking the substrate out of said apparatus without exposing said thin-film depositing chamber to atmosphere;

resistance measuring means for measuring a resistance of the thin metal film on the substrate, on a path along which the substrate is removed from said load-lock chamber out of said apparatus so as to be stored; and controlling means for controlling a thin film deposition in said thin-film depositing chamber according to the measured resistance so that a thin metal film with a target thickness is deposited on a next substrate.

* * * * *